United States Patent
Stoessel et al.

(10) Patent No.: US 10,249,828 B2
(45) Date of Patent: Apr. 2, 2019

(54) ORGANIC ELECTROLUMINESCENT DEVICE

(71) Applicant: Merck Patent GmbH, Darmstadt (DE)

(72) Inventors: Philipp Stoessel, Frankfurt am Main (DE); Amir Hossain Parham, Frankfurt am Main (DE); Christof Pflumm, Darmstadt (DE); Anja Jatsch, Frankfurt am Main (DE); Joachim Kaiser, Darmstadt (DE)

(73) Assignee: Merck Patent GmbH (DE)

( * ) Notice: Subject to any disclaimer, the term of this patent is extended or adjusted under 35 U.S.C. 154(b) by 582 days.

(21) Appl. No.: 14/782,722

(22) PCT Filed: Mar. 18, 2014

(86) PCT No.: PCT/EP2014/000741
§ 371 (c)(1),
(2) Date: Oct. 6, 2015

(87) PCT Pub. No.: WO2014/166585
PCT Pub. Date: Oct. 16, 2014

(65) Prior Publication Data
US 2016/0093813 A1 Mar. 31, 2016

(30) Foreign Application Priority Data

Apr. 8, 2013 (EP) .................................. 13001800

(51) Int. Cl.
*C09K 11/06* (2006.01)
*H01L 51/00* (2006.01)
*H01L 51/50* (2006.01)
*H01L 51/56* (2006.01)

(52) U.S. Cl.
CPC .......... *H01L 51/0072* (2013.01); *C09K 11/06* (2013.01); *H01L 51/0067* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1044* (2013.01); *C09K 2211/1059* (2013.01); *H01L 51/0002* (2013.01); *H01L 51/0003* (2013.01); *H01L 51/0004* (2013.01); *H01L 51/0008* (2013.01); *H01L 51/0052* (2013.01); *H01L 51/0071* (2013.01); *H01L 51/5004* (2013.01); *H01L 51/5012* (2013.01); *H01L 51/5016* (2013.01); *H01L 51/56* (2013.01); *H01L 2251/552* (2013.01)

(58) Field of Classification Search
CPC ............ C09K 11/06; C09K 2211/1007; C09K 2211/1011; C09K 2211/1014; C09K 2211/1029; C09K 2211/1033; C09K 2211/1044; C09K 2211/1059; H01L 2251/552; H01L 51/0002; H01L 51/0003; H01L 51/0004; H01L 51/0008; H01L 51/0052; H01L 51/0067; H01L 51/0071; H01L 51/0072; H01L 51/5004; H01L 51/5012; H01L 51/5016; H01L 51/56

See application file for complete search history.

(56) References Cited

U.S. PATENT DOCUMENTS

| | | | |
|---|---|---|---|
| 8,993,129 B2 | 3/2015 | Endo et al. | |
| 9,040,172 B2 | 5/2015 | Parham et al. | |
| 9,066,410 B2 | 6/2015 | Breuning | |
| 9,126,970 B2 | 9/2015 | Pflumm et al. | |
| 9,543,526 B2 | 1/2017 | Ishiyama et al. | |
| 2010/0090238 A1 | 4/2010 | Mori et al. | |
| 2012/0097899 A1* | 4/2012 | Parham ............... | C07D 401/04 252/500 |
| 2012/0248968 A1 | 10/2012 | Ogiwara et al. | |
| 2012/0326141 A1* | 12/2012 | Pflumm ................. | C09K 11/06 257/40 |
| 2013/0032766 A1 | 2/2013 | Molt et al. | |
| 2014/0138669 A1 | 5/2014 | Nakagawa et al. | |
| 2015/0318478 A1 | 11/2015 | Pflumm et al. | |

FOREIGN PATENT DOCUMENTS

| | | |
|---|---|---|
| CN | 102448946 A | 5/2012 |
| DE | 102009009277 A1 | 8/2010 |
| DE | 102009023155 A1 | 12/2010 |
| DE | 102009031021 A1 | 1/2011 |
| EP | 1956022 A1 | 8/2008 |
| EP | 2080762 A1 | 7/2009 |
| JP | 2012528088 A | 11/2012 |
| TW | 201114742 A | 5/2011 |
| TW | 201136931 A | 11/2011 |
| WO | WO-2011070963 A1 | 6/2011 |
| WO | WO-2011073149 A1 | 6/2011 |
| WO | WO-2012124412 A1 | 9/2012 |

(Continued)

OTHER PUBLICATIONS

International Search Report for PCT/EP2014/000741 dated Jun. 2, 2014.
Uoyama, H., et al., "Highly efficient organic light-emitting diodes from delayed fluorescence", Nature, vol. 492, No. 7428, (2012), pp. 234-238. Uoyama, H., et al., "Full Methods Supplement: Highly efficient organic light-emitting diodes from delayed fluorescence", Nature, vol. 492, No. 7428, (2012), Online Supplement.
Masui, K., et al., "Analysis of exciton annihilation in high-efficiency sky-blue organic light-emitting diodes with thermally activated delayed fluorescence", Organic Electronics, vol. 14, No. 11, (2013), pp. 2721-2726.

(Continued)

*Primary Examiner* — Dawn L Garrett
(74) *Attorney, Agent, or Firm* — Drinker Biddle & Reath LLP

(57) ABSTRACT

The present invention relates to organic electroluminescent devices which comprise mixtures of at least one matrix material of the formula (1) and an emitting material which has a small singlet-triplet separation.

16 Claims, No Drawings

(56) References Cited

FOREIGN PATENT DOCUMENTS

WO WO-2013011955 A1 1/2013
WO WO 2013/154064 A1 * 10/2013

OTHER PUBLICATIONS

Mehes, G., et al., "Enhanced Electroluminscence Efficiency in a Spiro-Acridine Derivative through Thermally Activated Delayed Fluorescence", Angewandte Chemie International Edition, vol. 51, No. 45, (2012), pp. 11311-11315.
Mehes, G., et al., "Supporting Information: Enhanced Electroluminescence Efficiency in a Spiro-Acridine Derivative through Thermally Activated Delayed Fluorescence", Angewandte Chemie International Edition, vol. 51, No. 45, (2012), Internet Supplement: http://dx.doi.org/10.1002/anie.201206289.
Meng, H., et al., "Organic Small Module Materials for Organic Light-Emitting Diodes", Organic Light-Emitting Materials and Devices, CRC Press, Chapter 3, (2006), pp. 296-414.
Tanaka, H., et al., "Efficient green thermally activated delayed fluorescence (TADF) from a phenoxazine-triphenyltriazine (PXZ-TRZ) derivative", Chemical Communications, vol. 48, No. 93, (2012), pp. 11392-11394.
Tanaka, H., et al., "Electronic Supplementary Information: Efficient green thermally activated delayed fluorescence (TADF) from a phenoxazine-triphenyltriazine (PXZ-TRZ) derivative", Chemical Communications, vol. 48, No. 93, (2012), Internet Supplement: http://www.rsc.org/suppdata/cc/c2/c2cc36237f/c2cc36237f.
Uoyama, H., et al., "Full Methods Supplement: Highly efficient organic light-emitting diodes from delayed fluorescence", Nature, vol. 492, No. 7428, (2012), Online Supplement.
Taiwanese Office Action for Taiwanese Application No. 103112535, dated Oct. 20, 2017.
English Translation of Japanese Office Action for Japanese Application No. 2016-506800, dated Mar. 6, 2018.
U.S. Appl. No. 14/782,387, filed Oct. 5, 2015.
U.S. Appl. No. 14/782,621, filed Oct. 6, 2015.
U.S. Appl. No. 14/782,974, filed Oct. 7, 2015.

* cited by examiner

ORGANIC ELECTROLUMINESCENT DEVICE

CROSS-REFERENCE TO RELATED APPLICATIONS

This application is a national stage application (under 35 U.S.C. § 371) of PCT/EP2014/000741, filed Mar. 18, 2014, which claims benefit of European Application No. 13001800.5, filed Apr. 8, 2013, both of which are incorporated herein by reference in their entirety.

The present invention relates to organic electroluminescent devices which comprise mixtures of a luminescent material having a small singlet-triplet separation in the emitting layer and certain matrix materials.

The structure of organic electroluminescent devices (OLEDs) in which organic semiconductors are employed as functional materials is described, for example, in U.S. Pat. Nos. 4,539,507, 5,151,629, EP 0676461 and WO 98/27136. The emitting materials employed here are also, in particular, organometallic iridium and platinum complexes, which exhibit phosphorescence instead of fluorescence (M. A. Baldo et al., Appl. Phys. Lett. 1999, 75, 4-6). For quantum-mechanical reasons, an up to four-fold increase in the energy and power efficiency is possible using organometallic compounds as phosphorescence emitters.

In spite of the good results achieved with organometallic iridium and platinum complexes, these also have, however, a number of disadvantages: thus, iridium and platinum are rare and expensive metals. It would therefore be desirable, for resource conservation, to be able to avoid the use of these rare metals. Furthermore, metal complexes of this type in some cases have lower thermal stability than purely organic compounds, in particular during sublimation, so that the use of purely organic compounds would also be advantageous for this reason so long as they result in comparably good efficiencies. Furthermore, blue-, in particular deep-blue-phosphorescent iridium and platinum emitters having high efficiency and a long lifetime can only be achieved with technical difficulty, so that there is also a need for improvement here. Furthermore, there is, in particular, a need for improvement in the lifetime of phosphorescent OLEDs comprising Ir or Pt emitters if the OLED is operated at elevated temperature, as is necessary for some applications.

An alternative development is the use of emitters which exhibit thermally activated delayed fluorescence (TADF) (for example H. Uoyama et al., Nature 2012, Vol. 492, 234). These are organic materials in which the energetic separation between the lowest triplet state $T_1$ and the first excited singlet state $S_1$ is so small that this energy separation is smaller or in the region of thermal energy. For quantum-statistical reasons, the excited states arise to the extent of 75% in the triplet state and to the extent of 25% in the singlet state on electronic excitation in the OLED. Since purely organic molecules usually cannot emit from the triplet state, 75% of the excited states cannot be utilised for emission, meaning that in principle only 25% of the excitation energy can be converted into light. However, if the energetic separation between the lowest triplet state and the lowest excited singlet state is not or is not significantly greater than the thermal energy, which is described by kT, the first excited singlet state of the molecule is accessible from the triplet state through thermal excitation and can be occupied thermally. Since this singlet state is an emissive state from which fluorescence is possible, this state can be used for the generation of light. Thus, the conversion of up to 100% of electrical energy into light is in principle possible on use of purely organic materials as emitters. Thus, an external quantum efficiency of greater than 19% is described in the prior art, which is of the same order of magnitude as for phosphorescent OLEDs. It is thus possible, using purely organic materials of this type, to achieve very good efficiencies and at the same time to avoid the use of rare metals, such as iridium or platinum. Furthermore, it is also possible using such materials to achieve highly efficient blue-emitting OLEDs.

The prior art describes the use of various matrix materials in combination with emitters which exhibit thermally activated delayed fluorescence (called TADF compound below), for example carbazole derivatives (H. Uoyama et al., Nature 2012, 492, 234; Endo et al., Appl. Phys. Lett. 2011, 98, 083302; Nakagawa et al., Chem. Commun. 2012, 48, 9580; Lee et al., Appl. Phys. Lett. 2012, 101, 093306/1), phosphine oxid-dibenzothiophene derivatives (H. Uoyama et al., Nature 2012, 492, 234) or silane derivatives (Mehes et al., Angew. Chem. Int. Ed. 2012, 51, 11311; Lee et al., Appl. Phys. Lett. 2012, 101, 093306/1). Indenocarbazole or indolocarbazole derivatives are not described as matrix materials in these devices In general, there is still a further need for improvement, in particular with respect to efficiency, voltage, lifetime and roll-off behaviour, in organic electroluminescent devices which exhibit emission by the TADF mechanism. The technical object on which the present invention is based is thus the provision of OLEDs whose emission is based on TADF and which have improved properties, in particular with respect to one or more of the above-mentioned properties.

Surprisingly, it has been found that organic electroluminescent devices which have an organic TADF molecule and an indenocarbazole derivative, indolocarbazole derivative or one of the derivatives mentioned below in the emitting layer and have one or more layers which comprise an electron-conducting material having an LUMO of ≤−2.55 eV adjacent to this layer on the cathode side achieve this object and result in improvements in the organic electroluminescent device. The present invention therefore relates to organic electroluminescent devices of this type.

The present invention relates to an organic electroluminescent device comprising cathode, anode and emitting layer which comprises the following compounds:
(A) a luminescent organic compound which has a separation between the lowest triplet state $T_1$ and the first excited singlet state $S_1$ of ≤0.15 eV; and
(B) a compound of the following formula (1),

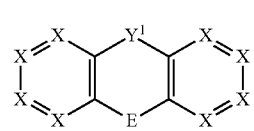

formula (1)

where the following applies to the symbols used:
X is on each occurrence, identically or differently, CR or N, or a group X-X stands for a group of the following formula (2), with the proviso that at least one group X-X in the compound of the formula (1) stands for a group of the formula (2) and that a maximum of one group X-X per ring stands for a group of the formula (2),

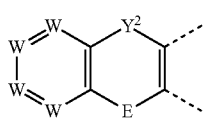

formula (2)

where the C atoms with the dashed bonds indicate the bonding of the group;

$Y^1$, $Y^2$ are selected on each occurrence, identically or differently, from the group consisting of $CR_2$, NR, O, S, $SiR_2$, BR, PR and P(=O)R;

E is selected on each occurrence, identically or differently, from the group consisting of a single bond, $CR_2$, NR, O, S, $SiR_2$, BR, PR and P(=O)R;

W is on each occurrence, identically or differently, CR or N;

R is selected on each occurrence, identically or differently, from the group consisting of H, D, F, Cl, Br, I, CN, $NO_2$, $N(Ar)_2$, $N(R^1)_2$, C(=O)Ar, C(=O)$R^1$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^1$, where one or more non-adjacent $CH_2$ groups may be replaced by $R^1C=CR^1$, C≡C, $Si(R^1)_2$, C=O, C=S, C=$NR^1$, P(=O)($R^1$), SO, $SO_2$, $NR^1$, O, S or CON$R^1$ and where one or more H atoms may be replaced by D, F, Cl, Br, I, CN or $NO_2$, an aromatic or heteroaromatic ring system having 5 to 80 aromatic ring atoms, which may in each case be substituted by one or more radicals $R^1$, an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, where two or more adjacent substituents R may optionally form a monocyclic or polycyclic, aliphatic, aromatic or heteroaromatic ring system, which may be substituted by one or more radicals $R^1$;

$R^1$ is selected on each occurrence, identically or differently, from the group consisting of H, D, F, Cl, Br, I, CN, $NO_2$, $N(Ar)_2$, $N(R^2)_2$, C(=O)Ar, C(=O)$R^2$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^2$, where one or more non-adjacent $CH_2$ groups may be replaced by $R^2C=CR^2$, C≡C, $Si(R^2)_2$, C=O, C=S, C=$NR^2$, P(=O)($R^2$), SO, $SO_2$, $NR^2$, O, S or CON$R^2$ and where one or more H atoms may be replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which may be substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which may be substituted by one or more radicals $R^2$;

Ar is on each occurrence, identically or differently, an aromatic or heteroaromatic ring system having 5-30 aromatic ring atoms, which may be substituted by one or more non-aromatic radicals $R^2$; two radicals Ar which are bonded to the same N atom or P atom here may also be bridged to one another by a single bond or a bridge selected from N($R^2$), C($R^2$)$_2$, O or S;

$R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms may be replaced by D, F, Cl, Br, I or CN, where two or more adjacent substituents $R^2$ may form a mono- or polycyclic, aliphatic, aromatic or heteroaromatic ring system with one another.

The term "per ring" mentioned above and also used below relates, for the purposes of the present application, to each individual ring present in the compound of the formula (1), i.e. to each individual 5- or 6-membered ring.

Adjacent substituents in the sense of the present application are substituents which are either bonded to the same carbon atom or which are bonded to carbon atoms which are in turn bonded directly to one another.

An aryl group in the sense of this invention contains 6 to 60 C atoms; a heteroaryl group in the sense of this invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed (fused) aryl or heteroaryl group, for example naphthalene, anthracene, phenanthrene, quinoline, isoquinoline, etc. Aromatic rings linked to one another by a single bond, such as, for example, biphenyl, are, by contrast, not referred to as an aryl or heteroaryl group, but instead as an aromatic ring system.

An aromatic ring system in the sense of this invention contains 6 to 80 C atoms in the ring system. A heteroaromatic ring system in the sense of this invention contains 2 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit, such as, for example, a C, N or O atom. Thus, for example, systems such as fluorene, 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are connected, for example, by a short alkyl group.

For the purposes of the present invention, an aliphatic hydrocarbon radical or an alkyl group or an alkenyl or alkynyl group, which may contain 1 to 40 C atoms and in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, neopentyl, cyclopentyl, n-hexyl, neohexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy or 2,2,2-trifluoroethoxy. A thioalkyl group having 1 to 40 C atoms is taken to mean, in particular, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethyl-thio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio. In general, alkyl, alkoxy or thioalkyl groups in accordance with the present invention may be straight-chain, branched or cyclic, where one or more non-adjacent $CH_2$ groups may be replaced by the above-mentioned groups; furthermore, one or more H atoms may also be replaced by D, F, Cl, Br, I, CN or $NO_2$, preferably F, Cl or CN, furthermore preferably F or CN, particularly preferably CN.

An aromatic or heteroaromatic ring system having 5-30 or 5-60 aromatic ring atoms respectively, which may also in each case be substituted by the above-mentioned radicals R, $R^1$ or $R^2$, is taken to mean, in particular, groups derived from benzene, naphthalene, anthracene, benzanthracene, phenanthrene, pyrene, chrysene, perylene, fluoranthene, naphthacene, pentacene, benzopyrene, biphenyl, biphenylene, terphenyl, triphenylene, fluorene, spirobifluorene, dihydrophenanthrene, dihydropyrene, tetrahydropyrene, cis- or trans-indenofluorene, cis- or trans-indenocarbazole, cis- or trans-indolocarbazole, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, hexaazatriphenylene, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or groups derived from combinations of these systems.

The luminescent organic compound which has a separation between the lowest triplet state $T_1$ and the first excited singlet state $S_1$ of ≤0.15 eV is described in greater detail below. This is a compound which exhibits TADF (thermally activated delayed fluorescence). This compound is abbreviated to "TADF compound" in the following description.

An organic compound in the sense of the present invention is a carbon-containing compound which contains no metals. In particular, the organic compound is built up from the elements C, H, D, B, Si, N, P, O, S, F, Cl, Br and I.

A luminescent compound in the sense of the present invention is taken to mean a compound which is capable of emitting light at room temperature on optical excitation in an environment as is present in the organic electroluminescent device. The compound preferably has a luminescence quantum efficiency of at least 40%, particularly preferably at least 50%, very particularly preferably at least 60% and especially preferably at least 70%. The luminescence quantum efficiency is determined here in a layer in a mixture with the matrix material, as is to be employed in the organic electroluminescent device. The way in which the determination of the luminescence quantum yield is carried out for the purposes of the present invention is described in detail in general terms in the example part.

It is furthermore preferred for the TADF compound to have a short decay time. The decay time is preferably ≤50 μs. The way in which the decay time is determined for the purposes of the present invention is described in detail in general terms in the example part.

The energy of the lowest excited singlet state ($S_1$) and of the lowest triplet state ($T_1$) is determined by quantum-chemical calculation. The way in which this determination is carried out in the sense of the present invention is generally described in detail in the example part.

As described above, the separation between $S_1$ and $T_1$ can be a maximum of 0.15 eV in order that the compound is a TADF compound in the sense of the present invention. The separation between $S_1$ and $T_1$ is preferably ≤0.10 eV, particularly preferably ≤0.08 eV, very particularly preferably ≤0.05 eV.

The TADF compound is preferably an aromatic compound which has both donor and also acceptor substituents, where the LUMO and the HOMO of the compound only spatially overlap weakly. What is meant by donor or acceptor substituents is known in principle to the person skilled in the art. Suitable donor substituents are, in particular, diaryl- and diheteroarylamino groups and carbazole groups or carbazole derivatives, each of which are preferably bonded to the aromatic compound via N. These groups may also be substituted further. Suitable acceptor substituents are, in particular, cyano groups, but also, for example, electron-deficient heteroaryl groups, which may also be substituted further.

In order to prevent exciplex formation in the emitting layer, it is preferred for the following to apply to LUMO (TADF), i.e. the LUMO of the TADF compound, and HOMO(matrix), i.e. the HOMO of the compound of the formula (1):

$$\text{LUMO(TADF)}-\text{HOMO(matrix)} > S_1(\text{TADF})-0.4\text{eV};$$

particularly preferably:

$$\text{LUMO(TADF)}-\text{HOMO(matrix)} > S_1(\text{TADF})-0.3\text{eV};$$

and very particularly preferably:

$$\text{LUMO(TADF)}-\text{HOMO(matrix)} > S_1(\text{TADF})-0.2\text{eV}.$$

$S_1$(TADF) here is the first excited singlet state $S_1$ of the TADF compound.

Examples of suitable TADF compounds are the structures shown in the following table.

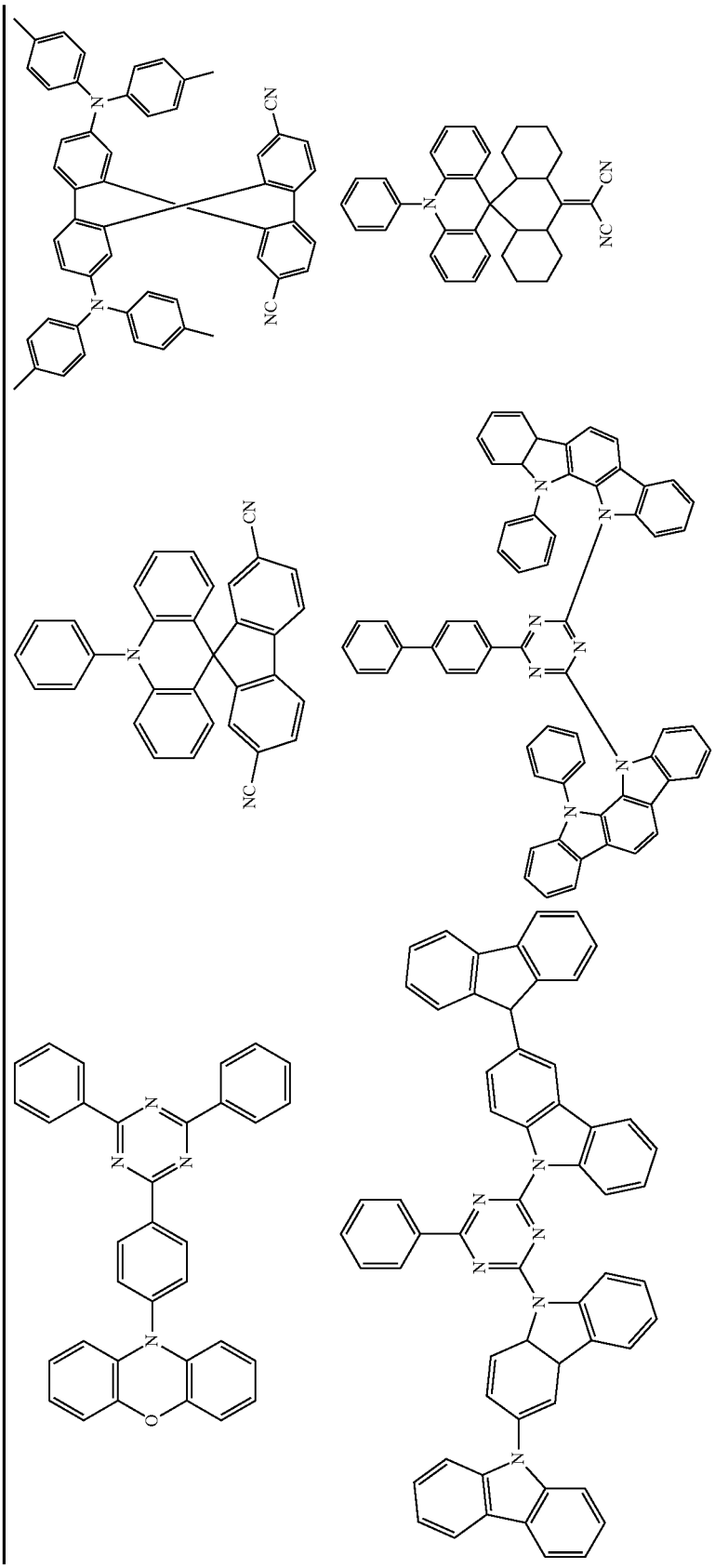

-continued
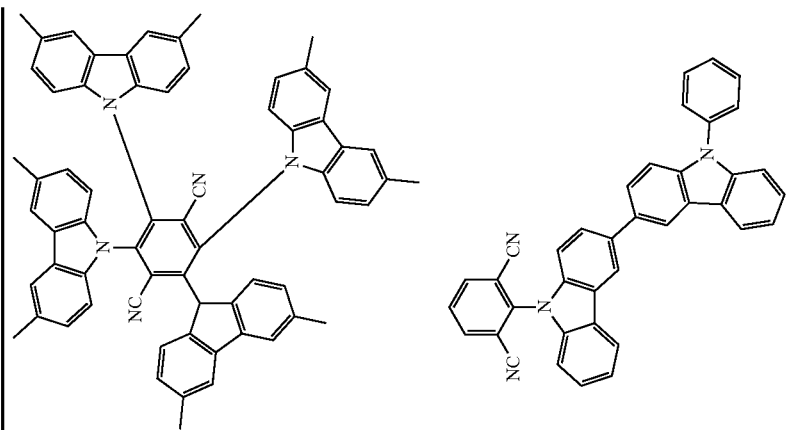
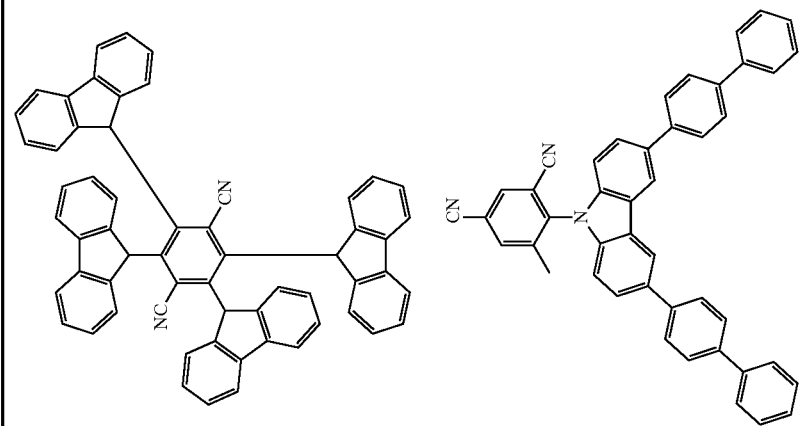
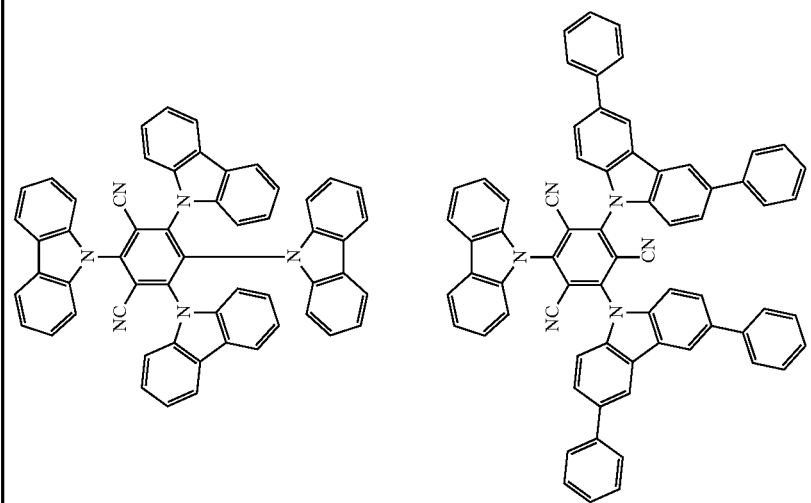

-continued
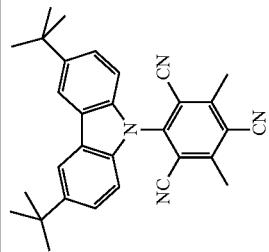
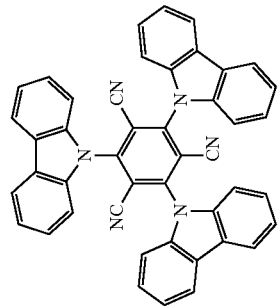
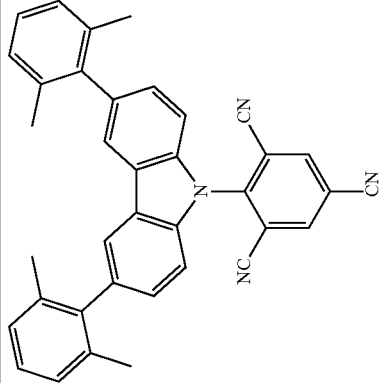
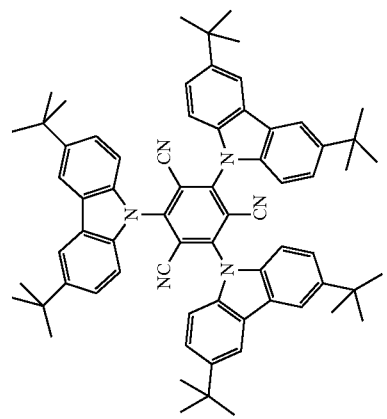
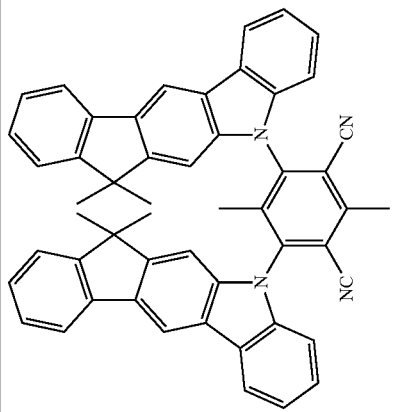
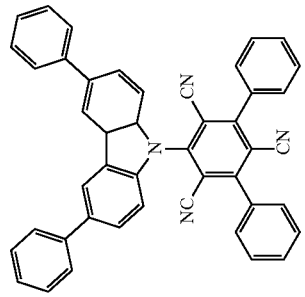

In a preferred embodiment of the invention, the compound of the formula (1) is the matrix material for the TADF compound. The TADF compound in the mixture is the emitting compound, i.e. the compound whose emission from the emitting layer is observed, while the compound of the formula (1), which serves as matrix material, does not contribute or does not contribute significantly to the emission of the mixture.

In a preferred embodiment of the invention, the emitting layer consists only of the compound of the formula (1) and the TADF compound.

In order that the compound which exhibits TADF is the emitting compound in the mixture of the emitting layer, it is preferred for the lowest triplet energy of the compound of the formula (1) to be a maximum of 0.1 eV lower than the triplet energy of the TADF compound. Particularly preferably, $T_1(\text{matrix}) \geq T_1(\text{TADF})$. The following particularly preferably applies: $T_1(\text{matrix}) - T_1(\text{TADF}) \geq 0.1$ eV, very particularly preferably $T_1(\text{matrix}) - T_1(\text{TADF}) \geq 0.2$ eV. $T_1(\text{matrix})$ here stands for the lowest triplet energy of the compound of the formula (1) and $T_1(\text{TADF})$ stands for the lowest triplet energy of the TADF compound. The triplet energy of the matrix is determined here by quantum-chemical calculation, as described in general terms below in the example part for the compounds which exhibit TADF.

Preferred embodiments of the compounds of the formula (1) are described below.

As described above, at least one group X-X in the compound of the formula (1) stands for a group of the formula (2) and a maximum of one group X-X per ring stands for a group of the formula (2). The group X-X is indicated here by a single bond. However, since the group X-X in the compound of the formula (1) is bonded in an aromatic group, it is clear that this is intended to mean an aromatic bond, i.e. the bond order of the bond between the two atoms X is between 1 and 2. The group of the formula (2) is bonded in any desired position here, and the groups $Y^1$ and $Y^2$ can either be in the cis- or in the trans-configuration to one another. The groups X which do not stand for a group of the formula (2) stand, identically or differently on each occurrence, for CR or N.

In a preferred embodiment of the invention, E is selected on each occurrence, identically or differently, from the group consisting of a single bond, $CR_2$, NR, O and S. E particularly preferably stands for a single bond.

Preferred compounds of the formula (1) are the compounds of the following formulae (3) to (9),

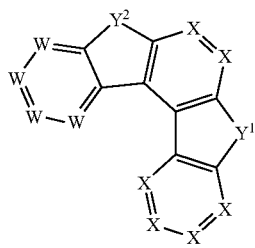

formula (3)

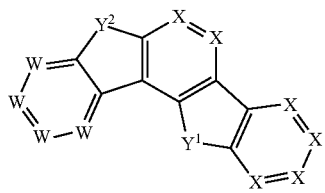

formula (4)

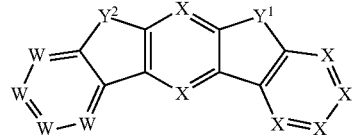

formula (5)

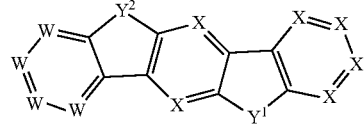

formula (6)

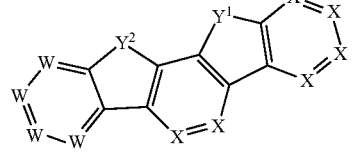

formula (7)

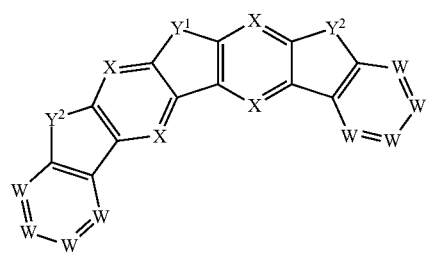

formula (8)

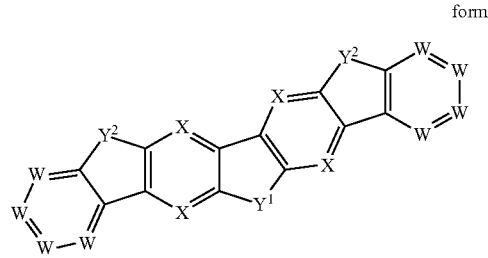

formula (9)

where W, $Y^1$, $Y^2$, R, $R^1$ and $R^2$ have the above-mentioned meanings, and furthermore:

X is on each occurrence, identically or differently, CR or N.

In preferred groups of the above-mentioned formulae (1) and (3) to (9), a maximum of two symbols X per ring stand for N, particularly preferably a maximum of one symbol X per ring stands for N. Very particularly preferably, the symbol X stands, identically or differently on each occurrence, for CR.

In preferred groups of the above-mentioned formulae (2) to (9), a maximum of two symbols W per ring stand for N, particularly preferably a maximum of one symbol W per ring stands for N. Very particularly preferably, the symbol W stands, identically or differently on each occurrence, for CR.

Especially preferably, all symbols X and all symbols W in the formulae (3) to (9) stand, identically or differently, for CR.

Preferred embodiments of the formulae (3) to (9) are the compounds of the following formulae (3a) to (9a), formula (3a)
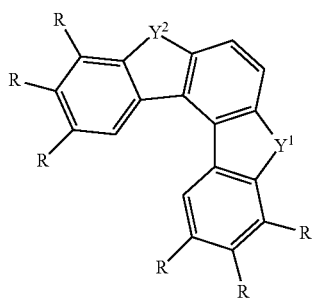

formula (4a)
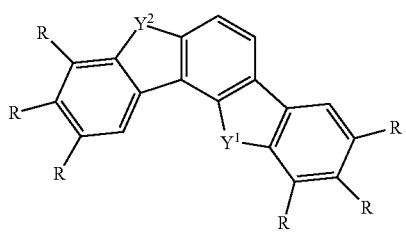

formula (5a)
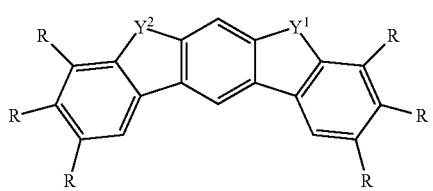

formula (6a)
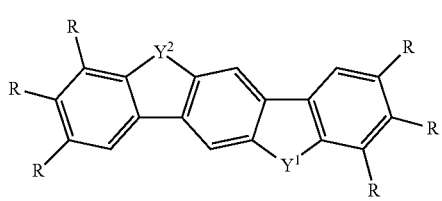

formula (7a)
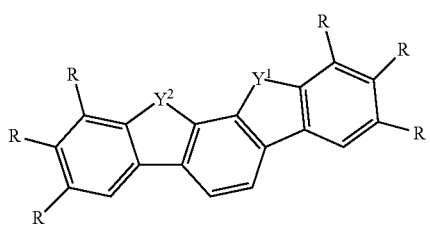

formula (8a)
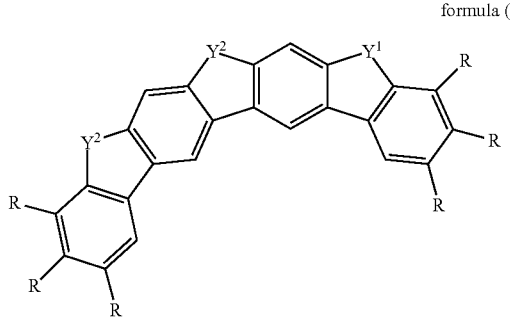

formula (9a)
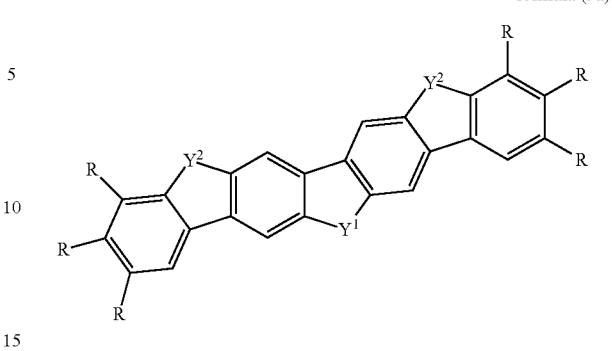

where the symbols used have the above-mentioned meanings.

In a further preferred embodiment of the invention, $Y^1$ and $Y^2$ are selected, identically or differently on each occurrence, from the group consisting of $CR_2$, NR, O and S.

In the groups of the formulae (1) and (3) to (9) and (3a) to (9a), all combinations are suitable for the groups $Y^1$ and $Y^2$. Preferably, at least one group $Y^1$ and/or $Y^2$ stands for a heteroatom, i.e. at least one of the groups $Y^1$ and/or $Y^2$ is preferably different from $CR_2$.

Preferred combinations of $Y^1$ and $Y^2$ are the combinations shown in the following table.

| $Y^1$ | $Y^2$ |
|---|---|
| $CR_2$ | $CR_2$ |
| $CR_2$ | NR |
| $CR_2$ | O |
| $CR_2$ | S |
| NR | $CR_2$ |
| NR | NR |
| NR | O |
| NR | S |
| O | $CR_2$ |
| O | NR |
| O | O |
| O | S |
| S | $CR_2$ |
| S | NR |
| S | O |
| S | S |

Preference is given to compounds of the formulae (1) and (3) to (9) and (3a) to (9a) in which one of the groups $Y^1$ and $Y^2$ stands for $CR_2$ and the other of the groups $Y^1$ and $Y^2$ stands for NR or in which both groups $Y^1$ and $Y^2$ stand for NR or in which both groups $Y^1$ and $Y^2$ stand for O.

If $Y^1$ or $Y^2$ stands for NR, the substituent R which is bonded to this nitrogen atom preferably stands for an aromatic or heteroaromatic ring system having 5 to 24 aromatic ring atoms, which may also be substituted by one or more radicals $R^1$. In a particularly preferred embodiment, this substituent R stands, identically or differently on each occurrence, for an aromatic or heteroaromatic ring system having 6 to 24 aromatic ring atoms which has no condensed aryl groups and which has no condensed heteroaryl groups in which two or more aromatic or heteroaromatic 6-membered ring groups are condensed directly onto one another and which may in each case also be substituted by one or more radicals $R^1$. The aromatic or heteroaromatic ring systems here preferably contain no condensed aryl or heteroaryl groups in which more than two aromatic six-membered rings are condensed directly onto one another. They particularly preferably contain absolutely no condensed aryl or heteroaryl groups in which aromatic six-membered rings are condensed directly onto one another. Thus, it is preferred for R to have, for example, no naphthyl groups or higher condensed aryl groups and likewise no quinoline groups, acridine groups, etc. By contrast, it is possible for R to have, for example, carbazole groups, dibenzofuran groups, etc., since no 6-membered aromatic or heteroaromatic ring groups in these structures are condensed directly onto one another. Preferred substituents R are selected from the group consisting of benzene, ortho-, meta- or para-biphenyl, ortho-, meta-, para- or branched terphenyl, ortho-, meta-, para- or branched quaterphenyl, 1-, 2-, 3- or 4-fluorenyl, 1-, 2-, 3- or 4-spirobifluorenyl, 1- or 2-naphthyl, pyrrole, furan, thiophene, indole, benzofuran, benzothiophene, 1-, 2- or 3-carbazole, 1-, 2- or 3-dibenzofuran, 1-, 2- or 3-dibenzothiophene, indenocarbazole, indolocarbazole, 2-, 3- or 4-pyridine, 2-, 4- or 5-pyrimidine, pyrazine, pyridazine, triazine, phenanthrene or combinations of two or three of these groups, each of which may be substituted by one or more radicals $R^1$.

If $Y^1$ or $Y^2$ stands for $CR_2$, R preferably stands, identically or differently on each occurrence, for a linear alkyl group having 1 to 10 C atoms or for a branched or cyclic alkyl group having 3 to 10 C atoms or for an aromatic or heteroaromatic ring system having 5 to 24 aromatic ring atoms, which may also be substituted by one or more radicals $R^1$. The radicals R here may also form a ring system with one another and thus form a spiro system. R very particularly preferably stands for a methyl group or for a phenyl group. A Spiro system may also arise here through ring formation of the phenyl groups.

In a preferred embodiment of the invention, at least one of the groups $Y^1$ and $Y^2$ stands for NR, and the corresponding group R stands for an aromatic or heteroaromatic ring system, as described above. In this case, it may also be preferred for all substituents R which are bonded to the skeleton of the compound of the formula (1) or the preferred embodiments to stand for H.

In a further preferred embodiment of the compound of the formula (1) or the preferred embodiments mentioned above, at least one substituent R which is bonded to the skeleton of the compound of the formula (1) stands for a radical other than H or D. In particular, at least one of the radicals R explicitly drawn-in in the formulae (3a) to (9a) is other than H or D.

This substituent R which is not equal to H or D preferably stands for an aromatic or heteroaromatic ring system having 5 to 24 aromatic ring atoms, which may also be substituted by one or more radicals $R^1$. In a particularly preferred embodiment, this substituent R stands, identically or differently on each occurrence, for an aromatic or heteroaromatic ring system having 6 to 24 aromatic ring atoms which has no condensed aryl groups and which has no condensed heteroaryl groups in which two or more aromatic or heteroaromatic 6-membered ring groups are condensed directly onto one another and which may in each case also be substituted by one or more radicals $R^1$. They particularly preferably contain absolutely no condensed aryl or heteroaryl groups in which aromatic six-membered rings are condensed directly onto one another. Thus, it is preferred for R to have, for example, no naphthyl groups or higher condensed aryl groups and likewise no quinoline groups, acridine groups, etc. By contrast, it is possible for R to have, for example, carbazole groups, dibenzofuran groups, fluorene groups, etc., since no 6-membered aromatic or heteroaromatic ring groups in these structures are condensed directly onto one another. Preferred substituents R are selected from the group consisting of benzene, ortho-, meta- or para-biphenyl, ortho-, meta-, para- or branched terphenyl, ortho-, meta-, para- or branched quaterphenyl, 1-, 2-, 3- or 4-fluorenyl, 1-, 2-, 3- or 4-spirobifluorenyl, 1- or 2-naphthyl, pyrrole, furan, thiophene, indole, benzofuran, benzothiophene, 1-, 2- or 3-carbazole, 1-, 2- or 3-dibenzofuran, 1-, 2- or 3-dibenzothiophene, indenocarbazole, indolocarbazole, 2-, 3- or 4-pyridine, 2-, 4- or 5-pyrimidine, pyrazine, pyridazine, triazine, phenanthrene or combinations of two or three of these groups, each of which may be substituted by one or more radicals $R^1$.

In a preferred embodiment of the invention, the above-mentioned preferences occur simultaneously. Preference is thus given to the compounds of the formulae (3a) to (9a) in which $Y^1$ and $Y^2$ are selected, identically or differently on each occurrence, from $CR_2$, NR, O and S, in particular in the above-mentioned combinations, and in which the above-mentioned preferences apply to R.

Examples of preferred compounds of the formula (1) are the compounds shown in the following table.

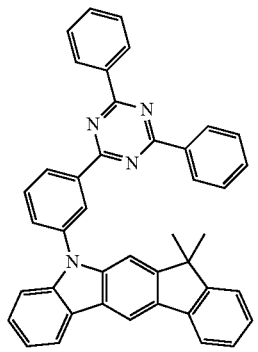 [SMILES: CC1(C)c2ccccc2-c2cc3c4ccccc4n(-c4cccc(-c5nc(-c6ccccc6)nc(-c6ccccc6)n5)c4)c3cc21]
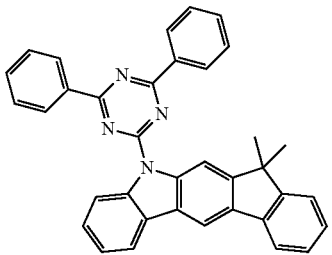 [SMILES: CC1(C)c2ccccc2-c2cc3c4ccccc4n(-c4nc(-c5ccccc5)nc(-c5ccccc5)n4)c3cc21]

-continued
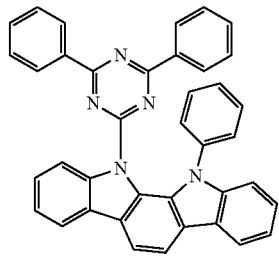 [SMILES: c1ccc(-c2nc(-c3ccccc3)nc(-n3c4ccccc4c4ccc5c6ccccc6n(-c6ccccc6)c5c43)n2)cc1]
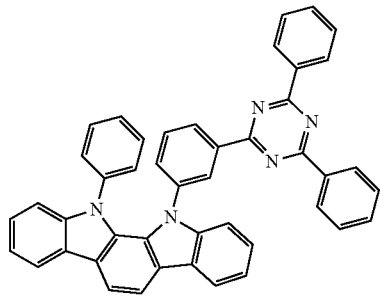 [SMILES: c1ccc(-c2nc(-c3ccccc3)nc(-c3cccc(-n4c5ccccc5c5ccc6c7ccccc7n(-c7ccccc7)c6c54)c3)n2)cc1]
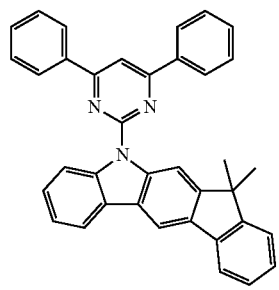 [SMILES: CC1(C)c2ccccc2-c2cc3c4ccccc4n(-c4nc(-c5ccccc5)cc(-c5ccccc5)n4)c3cc21]
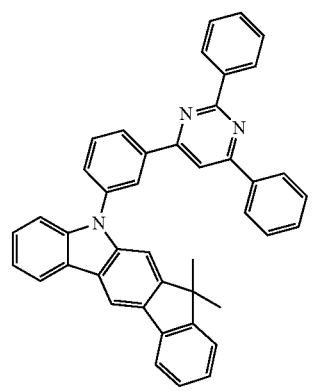 [SMILES: CC1(C)c2ccccc2-c2cc3c4ccccc4n(-c4cccc(-c5cc(-c6ccccc6)nc(-c6ccccc6)n5)c4)c3cc21]
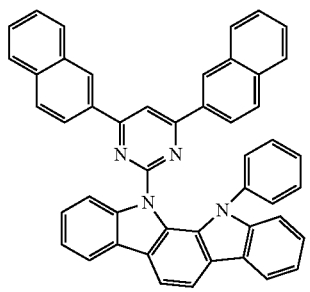
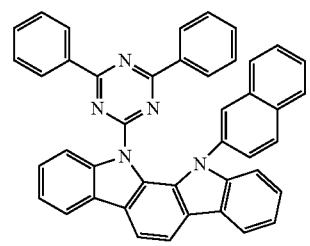 [SMILES: c1ccc(-c2nc(-c3ccccc3)nc(-n3c4ccccc4c4ccc5c6ccccc6n(-c6ccc7ccccc7c6)c5c43)n2)cc1]
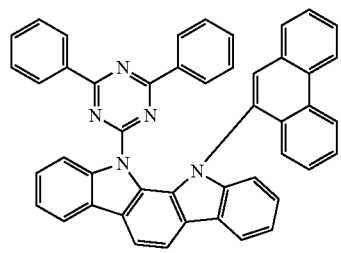 [SMILES: c1ccc(-c2nc(-c3ccccc3)nc(-n3c4ccccc4c4ccc5c6ccccc6n(-c6cc7ccccc7c7ccccc67)c5c43)n2)cc1]
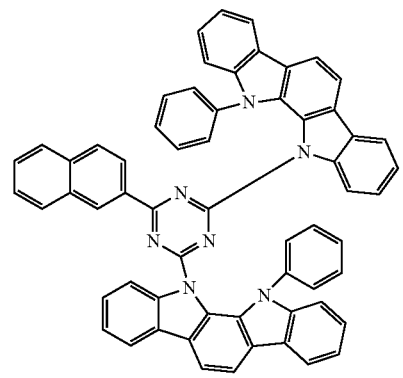 [SMILES: c1ccc(-n2c3ccccc3c3ccc4c5ccccc5n(-c5nc(-c6ccc7ccccc7c6)nc(-n6c7ccccc7c7ccc8c9ccccc9n(-c9ccccc9)c8c76)n5)c4c32)cc1]

-continued
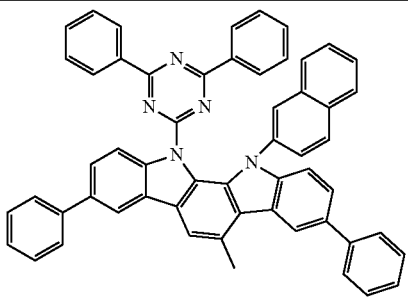
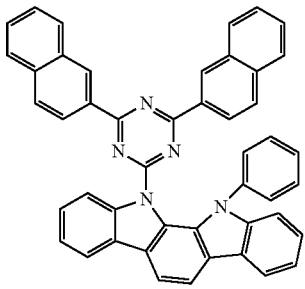 [SMILES: c1ccc(-n2c3ccccc3c3ccc4c5ccccc5n(-c5nc(-c6ccc7ccccc7c6)nc(-c6ccc7ccccc7c6)n5)c4c32)cc1]
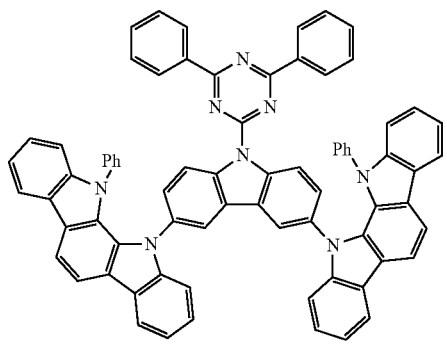 [SMILES: c1ccc(-c2nc(-c3ccccc3)nc(-n3c4ccc(-n5c6ccccc6c6ccc7c8ccccc8n(-c8ccccc8)c7c65)cc4c4cc(-n5c6ccccc6c6ccc7c8ccccc8n(-c8ccccc8)c7c65)ccc43)n2)cc1]
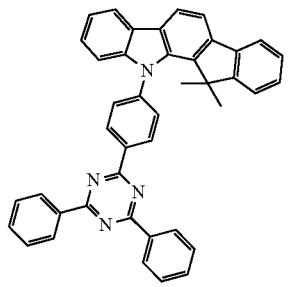 [SMILES: CC1(C)c2ccccc2-c2ccc3c4ccccc4n(-c4ccc(-c5nc(-c6ccccc6)nc(-c6ccccc6)n5)cc4)c3c21]
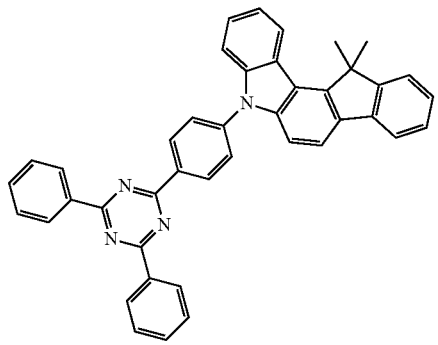 [SMILES: CC1(C)c2ccccc2-c2ccc3c(c21)c1ccccc1n3-c1ccc(-c2nc(-c3ccccc3)nc(-c3ccccc3)n2)cc1]
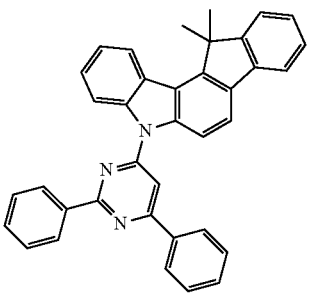 [SMILES: CC1(C)c2ccccc2-c2ccc3c(c21)c1ccccc1n3-c1cc(-c2ccccc2)nc(-c2ccccc2)n1]
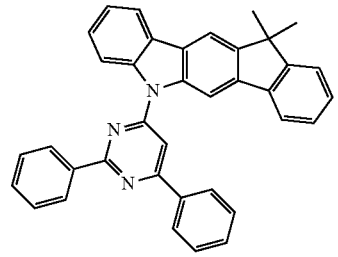 [SMILES: CC1(C)c2ccccc2-c2cc3c(cc21)c1ccccc1n3-c1cc(-c2ccccc2)nc(-c2ccccc2)n1]
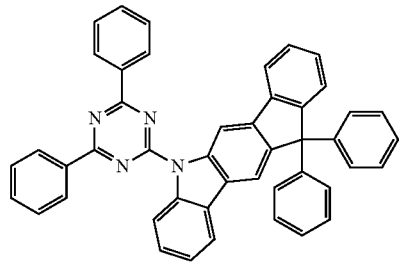 [SMILES: c1ccc(-c2nc(-c3ccccc3)nc(-n3c4ccccc4c4cc5c(cc43)-c3ccccc3C5(c3ccccc3)c3ccccc3)n2)cc1]
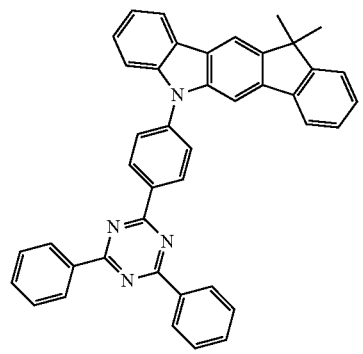 [SMILES: CC1(C)c2ccccc2-c2cc3c(cc21)c1ccccc1n3-c1ccc(-c2nc(-c3ccccc3)nc(-c3ccccc3)n2)cc1]
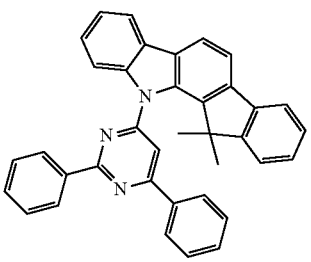 [SMILES: CC1(C)c2ccccc2-c2ccc3c4ccccc4n(-c4cc(-c5ccccc5)nc(-c5ccccc5)n4)c3c21]

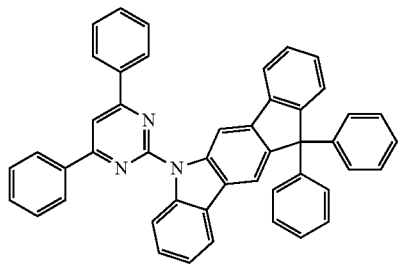 [SMILES: c1ccc(-c2cc(-c3ccccc3)nc(-n3c4ccccc4c4cc5c(cc43)-c3ccccc3C5(c3ccccc3)c3ccccc3)n2)cc1]
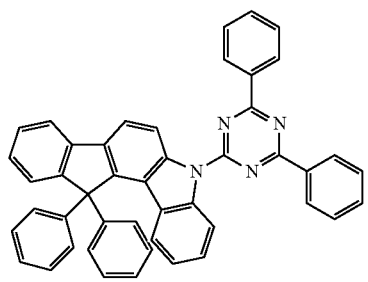 [SMILES: c1ccc(-c2nc(-c3ccccc3)nc(-n3c4ccccc4c4c5c(ccc43)-c3ccccc3C5(c3ccccc3)c3ccccc3)n2)cc1]
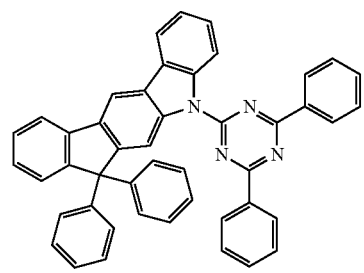 [SMILES: c1ccc(-c2nc(-c3ccccc3)nc(-n3c4ccccc4c4cc5c(cc43)C(c3ccccc3)(c3ccccc3)c3ccccc3-5)n2)cc1]
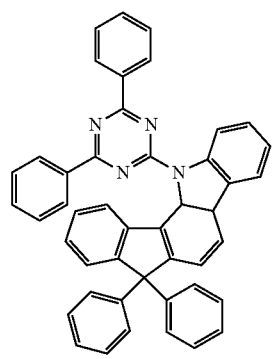 [SMILES: C1=CC2c3ccccc3N(c3nc(-c4ccccc4)nc(-c4ccccc4)n3)C2C2=C1C(c1ccccc1)(c1ccccc1)c1ccccc12]
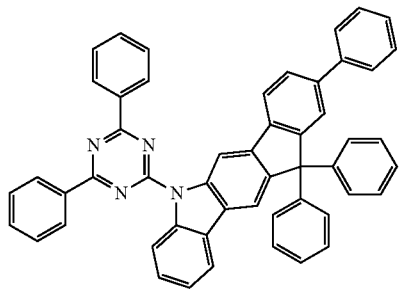 [SMILES: c1ccc(-c2ccc3c(c2)C(c2ccccc2)(c2ccccc2)c2cc4c5ccccc5n(-c5nc(-c6ccccc6)nc(-c6ccccc6)n5)c4cc2-3)cc1]
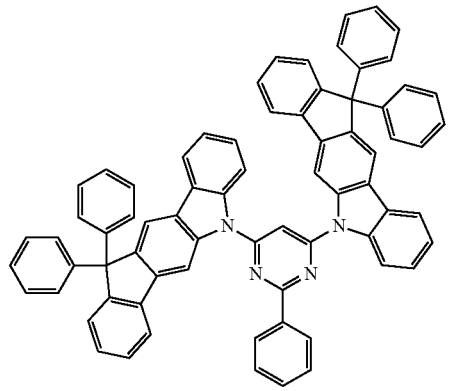 [SMILES: c1ccc(-c2nc(-n3c4ccccc4c4cc5c(cc43)-c3ccccc3C5(c3ccccc3)c3ccccc3)cc(-n3c4ccccc4c4cc5c(cc43)-c3ccccc3C5(c3ccccc3)c3ccccc3)n2)cc1]
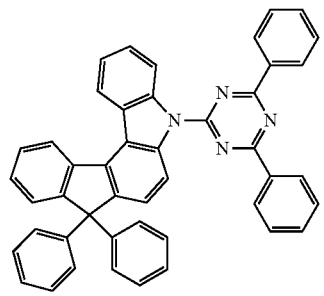 [SMILES: c1ccc(-c2nc(-c3ccccc3)nc(-n3c4ccccc4c4c5c(ccc43)C(c3ccccc3)(c3ccccc3)c3ccccc3-5)n2)cc1]
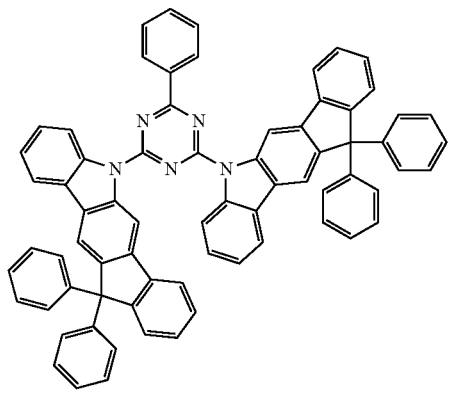 [SMILES: c1ccc(-c2nc(-n3c4ccccc4c4cc5c(cc43)-c3ccccc3C5(c3ccccc3)c3ccccc3)nc(-n3c4ccccc4c4cc5c(cc43)-c3ccccc3C5(c3ccccc3)c3ccccc3)n2)cc1]

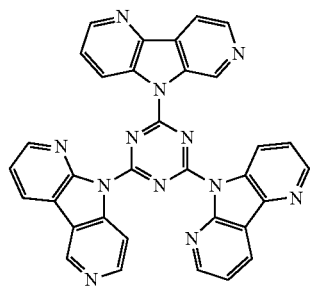 [SMILES: c1cnc2c(c1)c1cnccc1n2-c1nc(-n2c3cnccc3c3ncccc32)nc(-n2c3cccnc3c3cccnc32)n1]
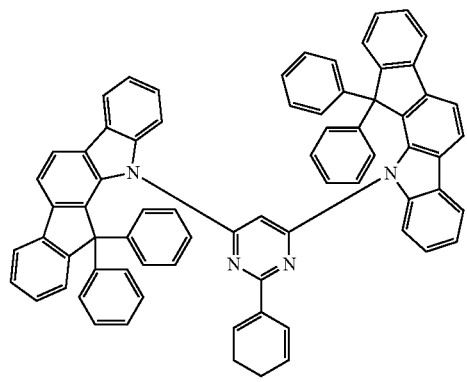 [SMILES: C1=CC(c2nc(-n3c4ccccc4c4ccc5c(c43)C(c3ccccc3)(c3ccccc3)c3ccccc3-5)cc(-n3c4ccccc4c4ccc5c(c43)C(c3ccccc3)(c3ccccc3)c3ccccc3-5)n2)=CCC1]
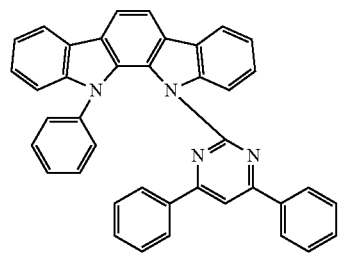 [SMILES: c1ccc(-c2cc(-c3ccccc3)nc(-n3c4ccccc4c4ccc5c6ccccc6n(-c6ccccc6)c5c43)n2)cc1]
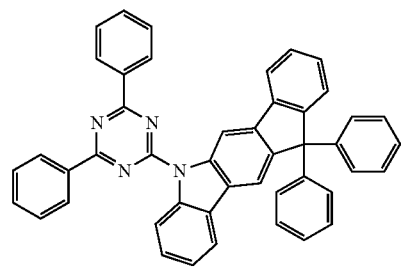 [SMILES: c1ccc(-c2nc(-c3ccccc3)nc(-n3c4ccccc4c4cc5c(cc43)-c3ccccc3C5(c3ccccc3)c3ccccc3)n2)cc1]
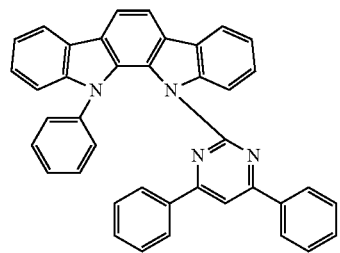 [SMILES: c1ccc(-c2cc(-c3ccccc3)nc(-n3c4ccccc4c4ccc5c6ccccc6n(-c6ccccc6)c5c43)n2)cc1]
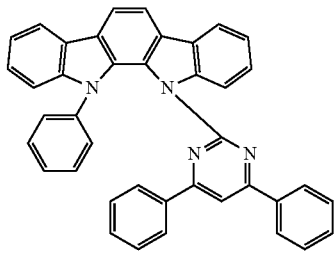
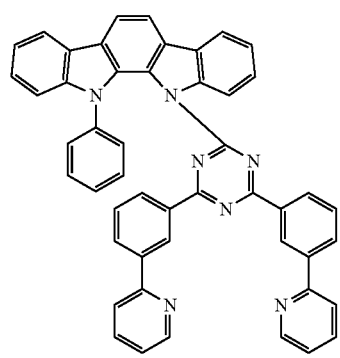 [SMILES: c1ccc(-n2c3ccccc3c3ccc4c5ccccc5n(-c5nc(-c6cccc(-c7ccccn7)c6)nc(-c6cccc(-c7ccccn7)c6)n5)c4c32)cc1]
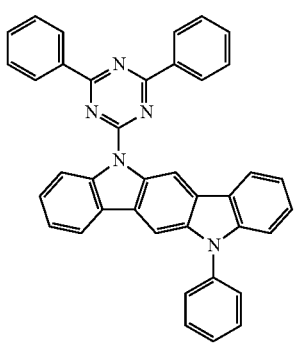 [SMILES: c1ccc(-c2nc(-c3ccccc3)nc(-n3c4ccccc4c4cc5c(cc43)c3ccccc3n5-c3ccccc3)n2)cc1]

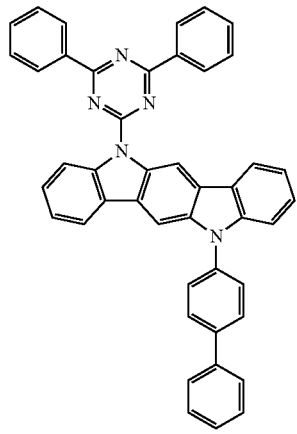 [SMILES: c1ccc(-c2ccc(-n3c4ccccc4c4cc5c(cc43)c3ccccc3n5-c3nc(-c4ccccc4)nc(-c4ccccc4)n3)cc2)cc1]
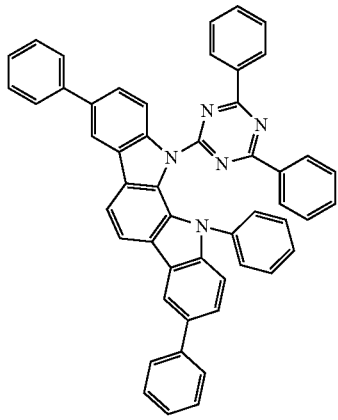 [SMILES: c1ccc(-c2ccc3c(c2)c2ccc4c5cc(-c6ccccc6)ccc5n(-c5nc(-c6ccccc6)nc(-c6ccccc6)n5)c4c2n3-c2ccccc2)cc1]
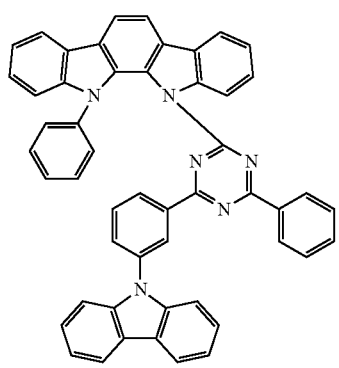 [SMILES: c1ccc(-c2nc(-c3cccc(-n4c5ccccc5c5ccccc54)c3)nc(-n3c4ccccc4c4ccc5c6ccccc6n(-c6ccccc6)c5c43)n2)cc1]
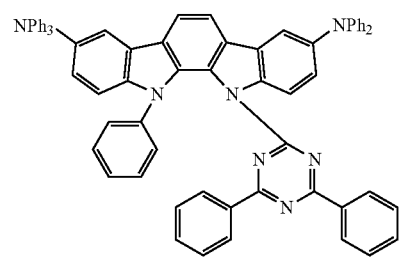
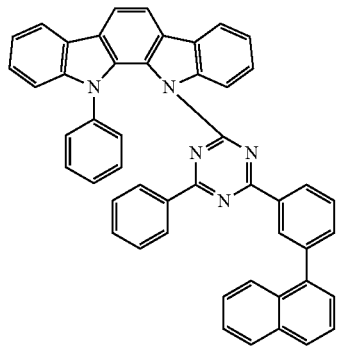 [SMILES: c1ccc(-c2nc(-c3cccc(-c4cccc5ccccc45)c3)nc(-n3c4ccccc4c4ccc5c6ccccc6n(-c6ccccc6)c5c43)n2)cc1]
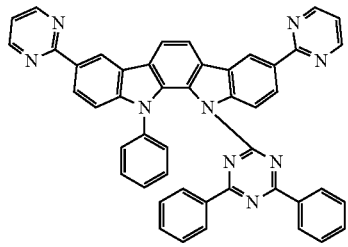 [SMILES: c1ccc(-c2nc(-c3ccccc3)nc(-n3c4ccc(-c5ncccn5)cc4c4ccc5c6cc(-c7ncccn7)ccc6n(-c6ccccc6)c5c43)n2)cc1]
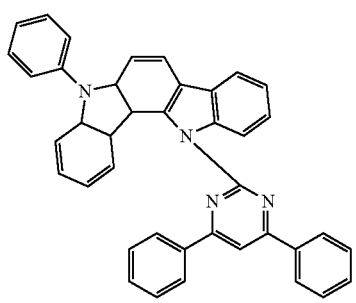 [SMILES: C1=CC2C3c4c(c5ccccc5n4-c4nc(-c5ccccc5)cc(-c5ccccc5)n4)C=CC3N(c3ccccc3)C2C=C1]
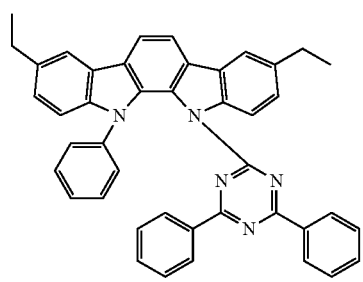 [SMILES: CCc1ccc2c(c1)c1ccc3c4cc(CC)ccc4n(-c4nc(-c5ccccc5)nc(-c5ccccc5)n4)c3c1n2-c1ccccc1]

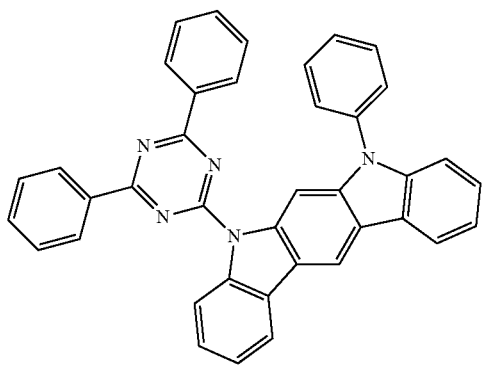 [SMILES: c1ccc(-c2nc(-c3ccccc3)nc(-n3c4ccccc4c4cc5c6ccccc6n(-c6ccccc6)c5cc43)n2)cc1]
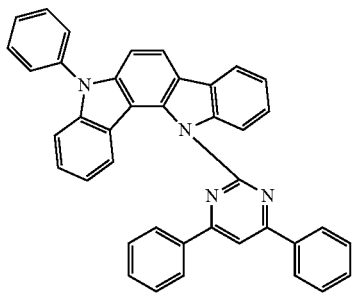 [SMILES: c1ccc(-c2cc(-c3ccccc3)nc(-n3c4ccccc4c4ccc5c(c6ccccc6n5-c5ccccc5)c43)n2)cc1]
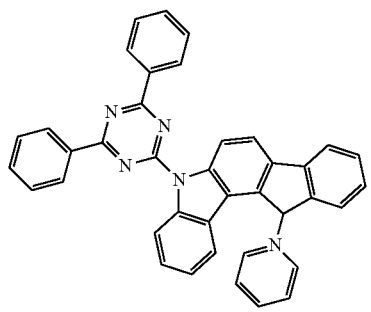
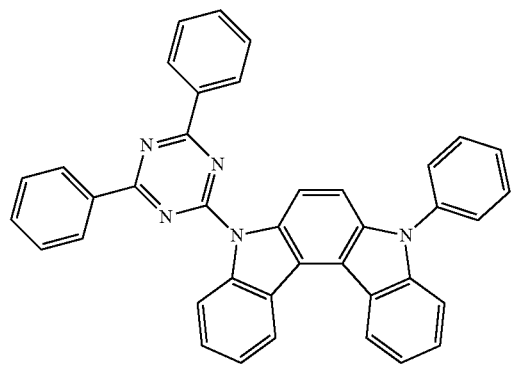 [SMILES: c1ccc(-c2nc(-c3ccccc3)nc(-n3c4ccccc4c4c5c6ccccc6n(-c6ccccc6)c5ccc43)n2)cc1]
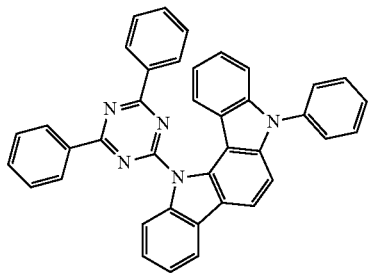 [SMILES: c1ccc(-c2nc(-c3ccccc3)nc(-n3c4ccccc4c4ccc5c(c6ccccc6n5-c5ccccc5)c43)n2)cc1]
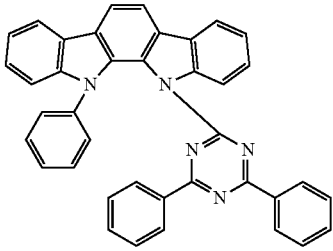
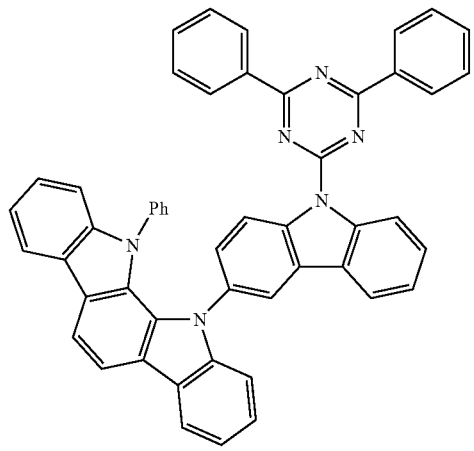 [SMILES: c1ccc(-c2nc(-c3ccccc3)nc(-n3c4ccccc4c4cc(-n5c6ccccc6c6ccc7c8ccccc8n(-c8ccccc8)c7c65)ccc43)n2)cc1]
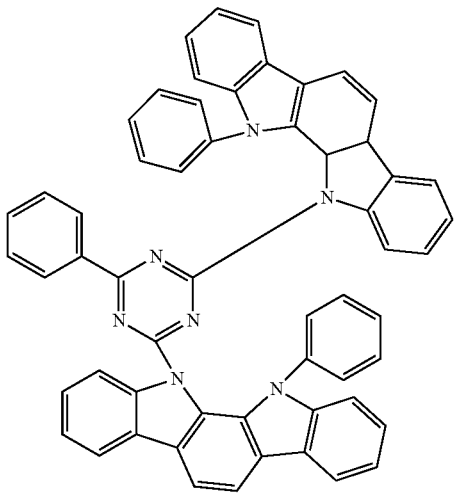 [SMILES: C1=CC2c3ccccc3N(c3nc(-c4ccccc4)nc(-n4c5ccccc5c5ccc6c7ccccc7n(-c7ccccc7)c6c54)n3)C2c2c1c1ccccc1n2-c1ccccc1]

-continued
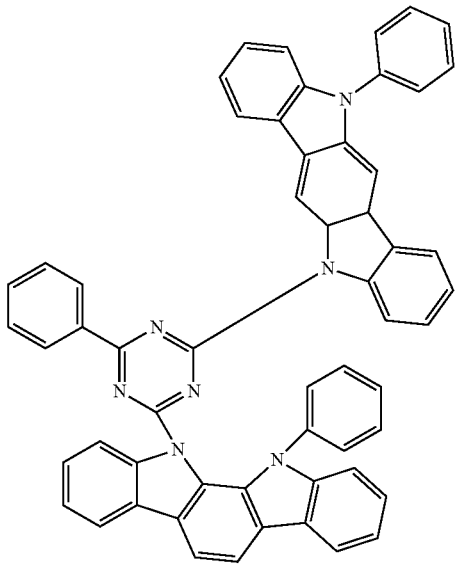 [SMILES: C1=c2c(n(-c3ccccc3)c3ccccc23)=CC2c3ccccc3N(c3nc(-c4ccccc4)nc(-n4c5ccccc5c5ccc6c7ccccc7n(-c7ccccc7)c6c54)n3)C12]
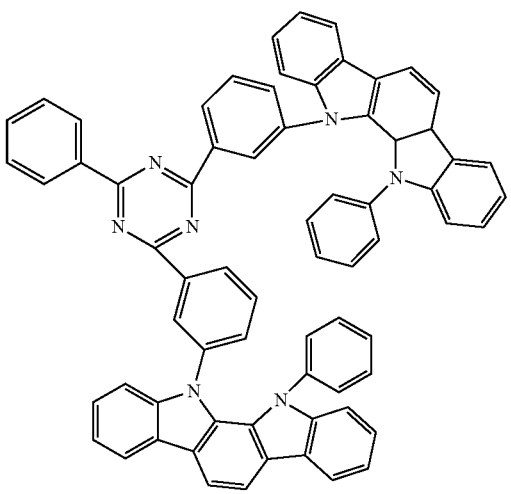 [SMILES: C1=CC2c3ccccc3N(c3ccccc3)C2c2c1c1ccccc1n2-c1cccc(-c2nc(-c3ccccc3)nc(-c3cccc(-n4c5ccccc5c5ccc6c7ccccc7n(-c7ccccc7)c6c54)c3)n2)c1]
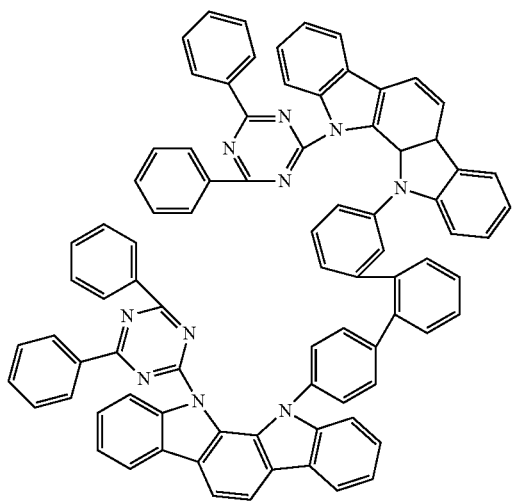 [SMILES: C1=CC2c3ccccc3N(c3cccc(-c4ccccc4-c4ccc(-n5c6ccccc6c6ccc7c8ccccc8n(-c8nc(-c9ccccc9)nc(-c9ccccc9)n8)c7c65)cc4)c3)C2c2c1c1ccccc1n2-c1nc(-c2ccccc2)nc(-c2ccccc2)n1]
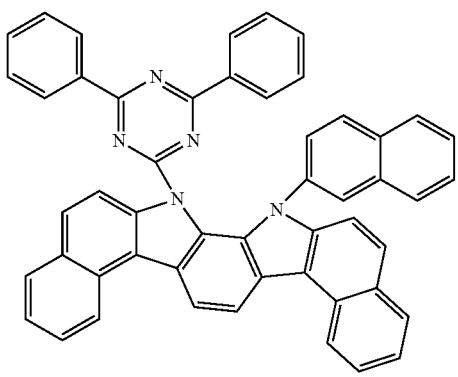 [SMILES: c1ccc(-c2nc(-c3ccccc3)nc(-n3c4ccc5ccccc5c4c4ccc5c6c7ccccc7ccc6n(-c6ccc7ccccc7c6)c5c43)n2)cc1]
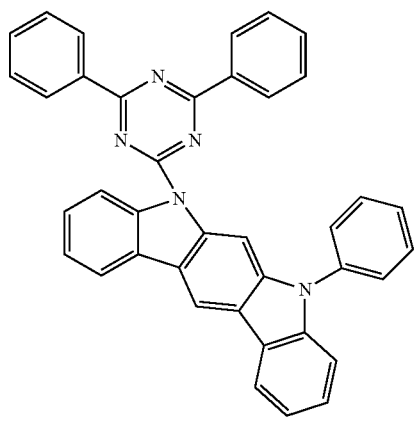 [SMILES: c1ccc(-c2nc(-c3ccccc3)nc(-n3c4ccccc4c4cc5c6ccccc6n(-c6ccccc6)c5cc43)n2)cc1]
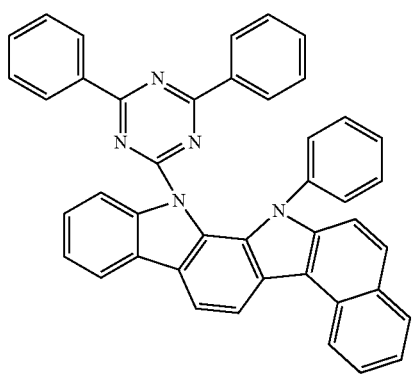 [SMILES: c1ccc(-c2nc(-c3ccccc3)nc(-n3c4ccccc4c4ccc5c6c7ccccc7ccc6n(-c6ccccc6)c5c43)n2)cc1]

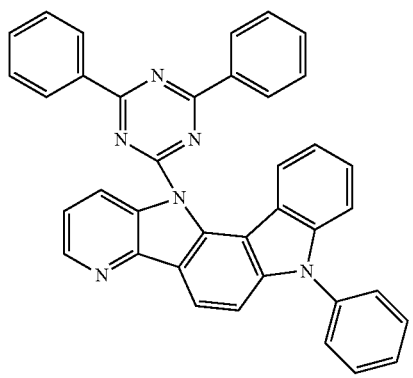 [SMILES: c1ccc(-c2nc(-c3ccccc3)nc(-n3c4cccnc4c4ccc5c(c6ccccc6n5-c5ccccc5)c43)n2)cc1]
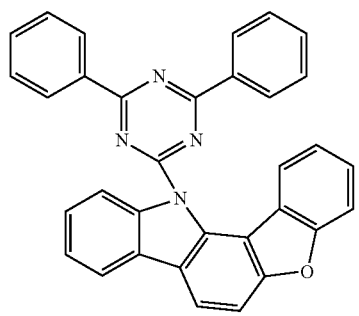 [SMILES: c1ccc(-c2nc(-c3ccccc3)nc(-n3c4ccccc4c4ccc5oc6ccccc6c5c43)n2)cc1]
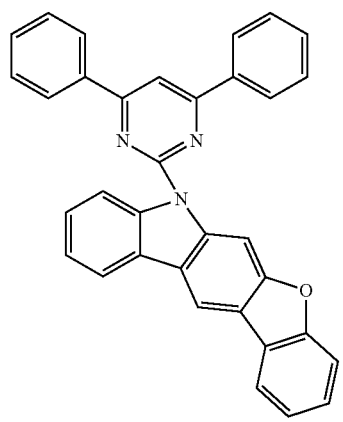 [SMILES: c1ccc(-c2cc(-c3ccccc3)nc(-n3c4ccccc4c4cc5c(cc43)oc3ccccc35)n2)cc1]
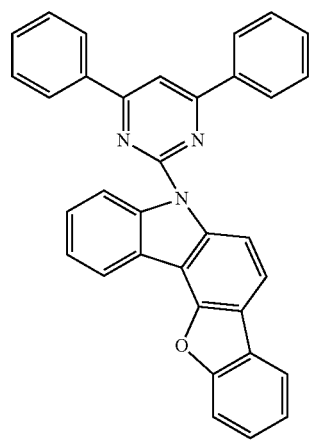 [SMILES: c1ccc(-c2cc(-c3ccccc3)nc(-n3c4ccccc4c4c5oc6ccccc6c5ccc43)n2)cc1]
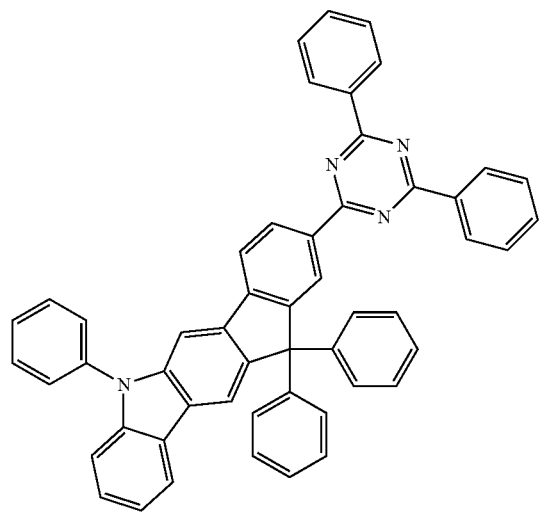 [SMILES: c1ccc(-c2nc(-c3ccccc3)nc(-c3ccc4c(c3)C(c3ccccc3)(c3ccccc3)c3cc5c6ccccc6n(-c6ccccc6)c5cc3-4)n2)cc1]
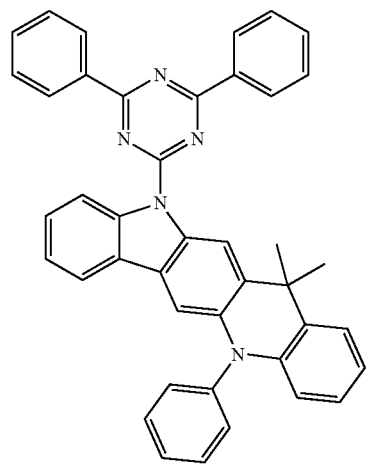 [SMILES: CC1(C)c2ccccc2N(c2ccccc2)c2cc3c4ccccc4n(-c4nc(-c5ccccc5)nc(-c5ccccc5)n4)c3cc21]

-continued
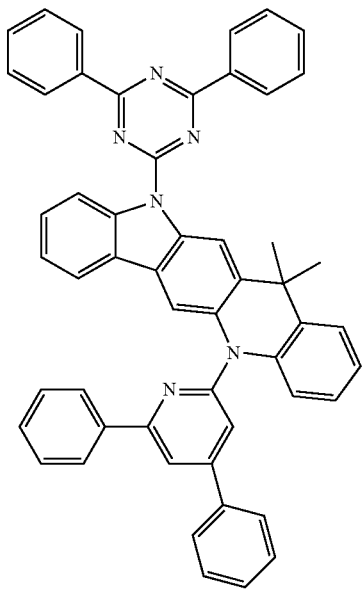 [SMILES: CC1(C)c2ccccc2N(c2cc(-c3ccccc3)cc(-c3ccccc3)n2)c2cc3c4ccccc4n(-c4nc(-c5ccccc5)nc(-c5ccccc5)n4)c3cc21]
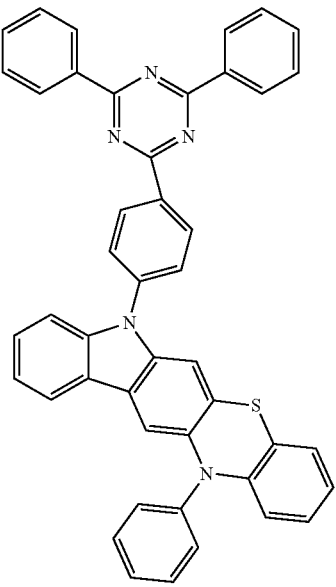 [SMILES: c1ccc(-c2nc(-c3ccccc3)nc(-c3ccc(-n4c5ccccc5c5cc6c(cc54)Sc4ccccc4N6c4ccccc4)cc3)n2)cc1]
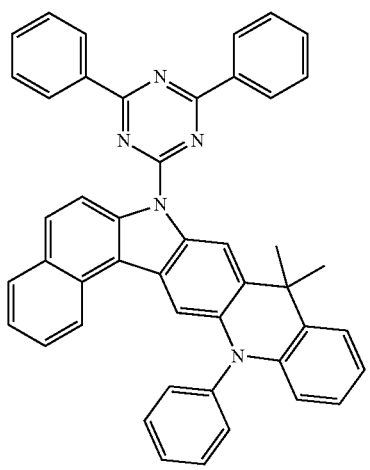 [SMILES: CC1(C)c2ccccc2N(c2ccccc2)c2cc3c4c5ccccc5ccc4n(-c4nc(-c5ccccc5)nc(-c5ccccc5)n4)c3cc21]
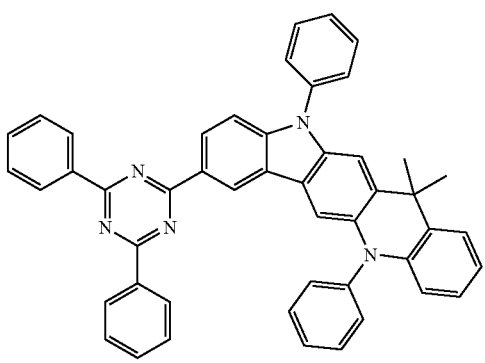 [SMILES: CC1(C)c2ccccc2N(c2ccccc2)c2cc3c4cc(-c5nc(-c6ccccc6)nc(-c6ccccc6)n5)ccc4n(-c4ccccc4)c3cc21]
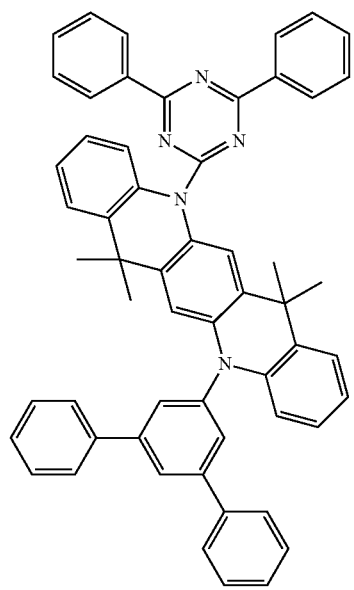 [SMILES: CC1(C)c2ccccc2N(c2cc(-c3ccccc3)cc(-c3ccccc3)c2)c2cc3c(cc21)N(c1nc(-c2ccccc2)nc(-c2ccccc2)n1)c1ccccc1C3(C)C]
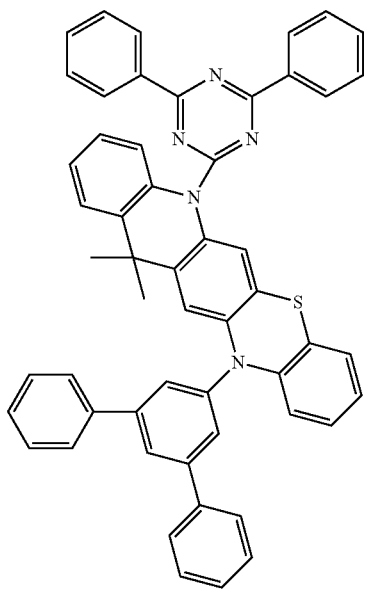 [SMILES: CC1(C)c2ccccc2N(c2nc(-c3ccccc3)nc(-c3ccccc3)n2)c2cc3c(cc21)N(c1cc(-c2ccccc2)cc(-c2ccccc2)c1)c1ccccc1S3]

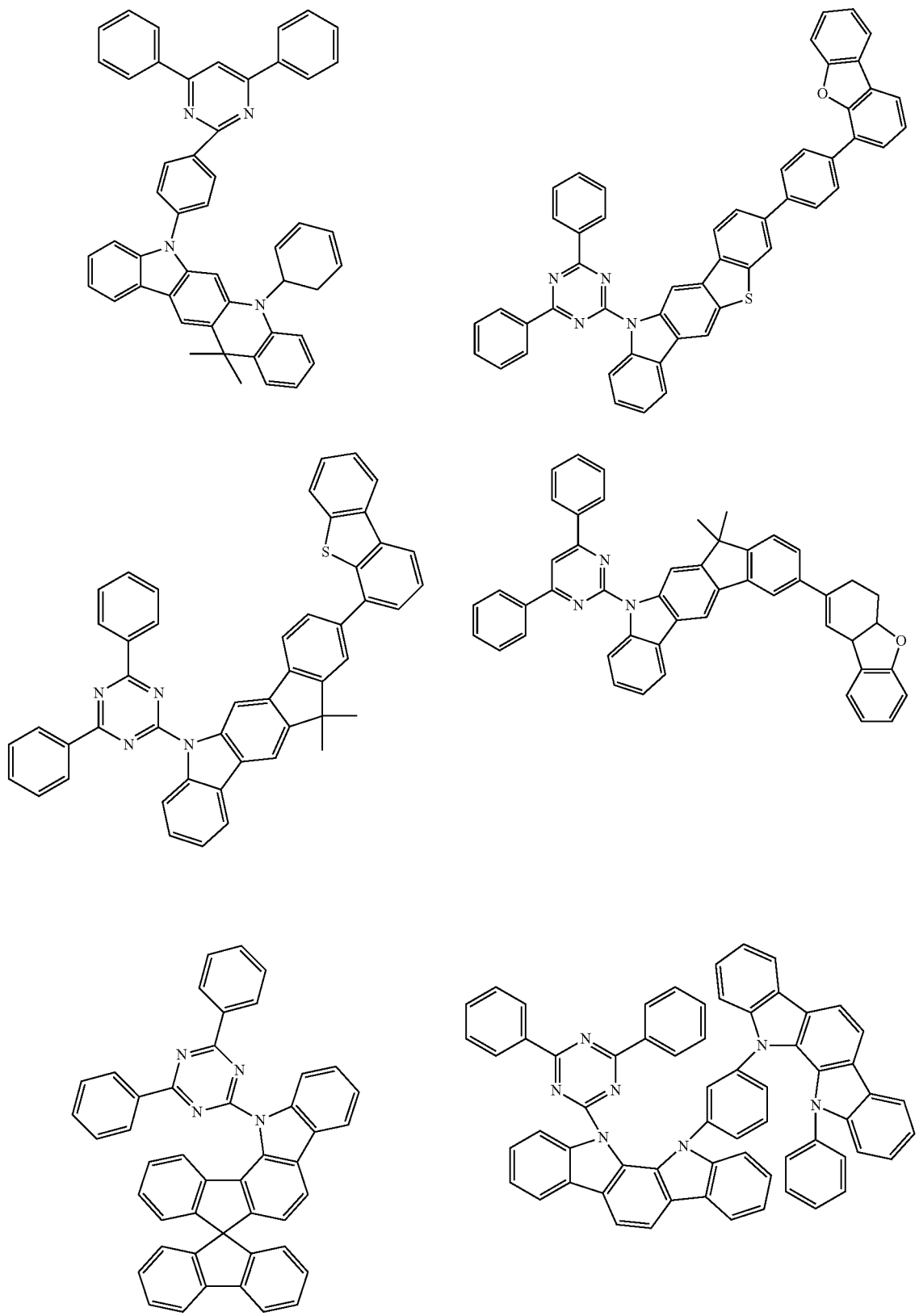

-continued
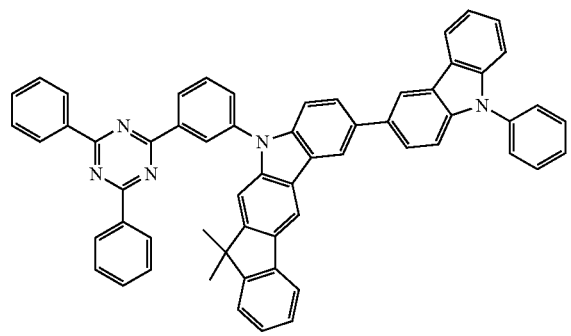 [SMILES: CC1(C)c2ccccc2-c2cc3c4cc(-c5ccc6c(c5)c5ccccc5n6-c5ccccc5)ccc4n(-c4cccc(-c5nc(-c6ccccc6)nc(-c6ccccc6)n5)c4)c3cc21] 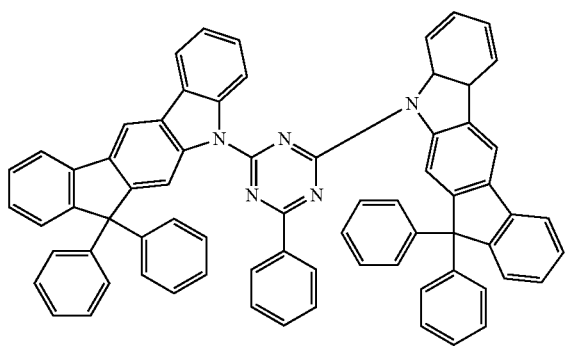 [SMILES: C1=CC2c3cc4c(cc3N(c3nc(-c5ccccc5)nc(-n5c6ccccc6c6cc7c(cc65)C(c5ccccc5)(c5ccccc5)c5ccccc5-7)n3)C2C=C1)C(c1ccccc1)(c1ccccc1)c1ccccc1-4]
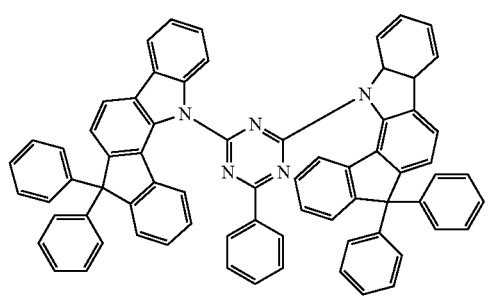 [SMILES: C1=CC2c3ccc4c(c3N(c3nc(-c5ccccc5)nc(-n5c6ccccc6c6ccc7c(c65)-c5ccccc5C7(c5ccccc5)c5ccccc5)n3)C2C=C1)-c1ccccc1C4(c1ccccc1)c1ccccc1] 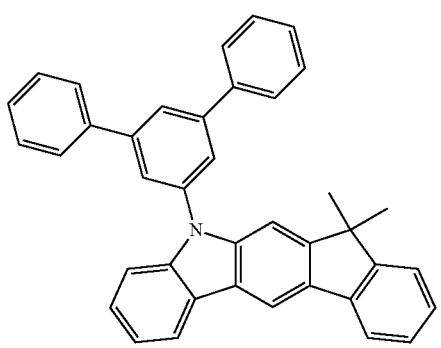 [SMILES: CC1(C)c2ccccc2-c2cc3c4ccccc4n(-c4cc(-c5ccccc5)cc(-c5ccccc5)c4)c3cc21]
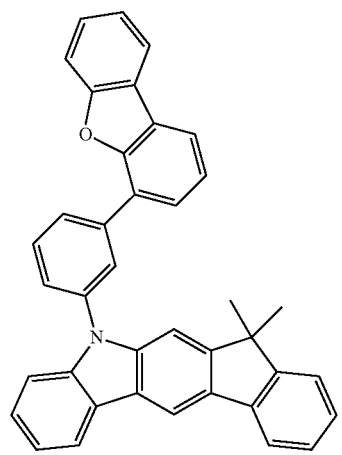 [SMILES: CC1(C)c2ccccc2-c2cc3c4ccccc4n(-c4cccc(-c5cccc6c5oc5ccccc56)c4)c3cc21] 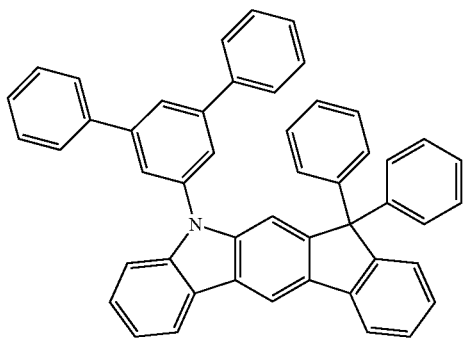 [SMILES: c1ccc(-c2cc(-c3ccccc3)cc(-n3c4ccccc4c4cc5c(cc43)C(c3ccccc3)(c3ccccc3)c3ccccc3-5)c2)cc1]
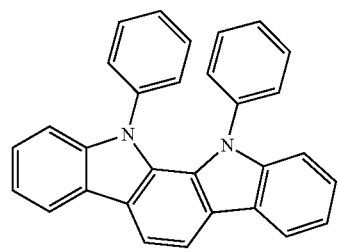 [SMILES: c1ccc(-n2c3ccccc3c3ccc4c5ccccc5n(-c5ccccc5)c4c32)cc1] 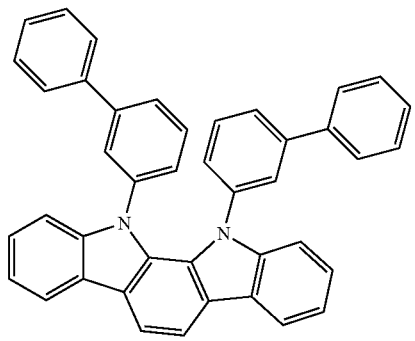 [SMILES: c1ccc(-c2cccc(-n3c4ccccc4c4ccc5c6ccccc6n(-c6cccc(-c7ccccc7)c6)c5c43)c2)cc1]

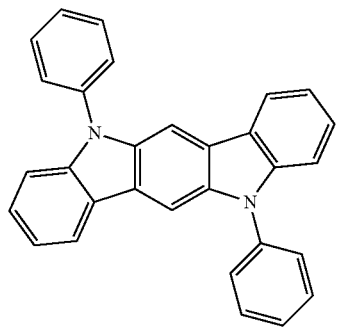 [SMILES: c1ccc(-n2c3ccccc3c3cc4c(cc32)c2ccccc2n4-c2ccccc2)cc1]
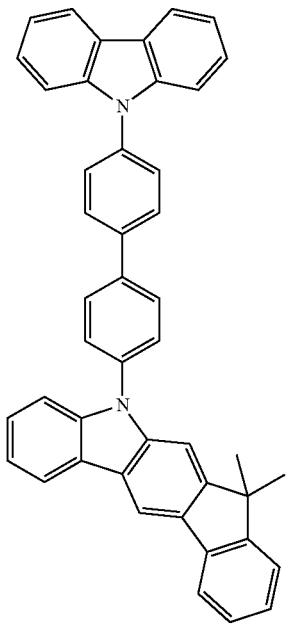 [SMILES: CC1(C)c2ccccc2-c2cc3c4ccccc4n(-c4ccc(-c5ccc(-n6c7ccccc7c7ccccc76)cc5)cc4)c3cc21]
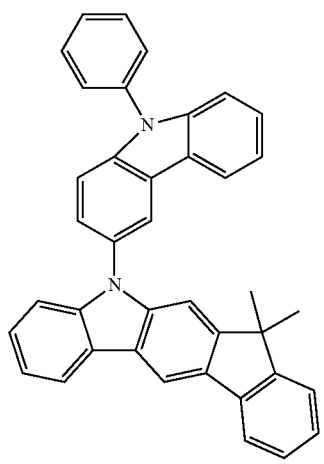 [SMILES: CC1(C)c2ccccc2-c2cc3c4ccccc4n(-c4ccc5c(c4)c4ccccc4n5-c4ccccc4)c3cc21]
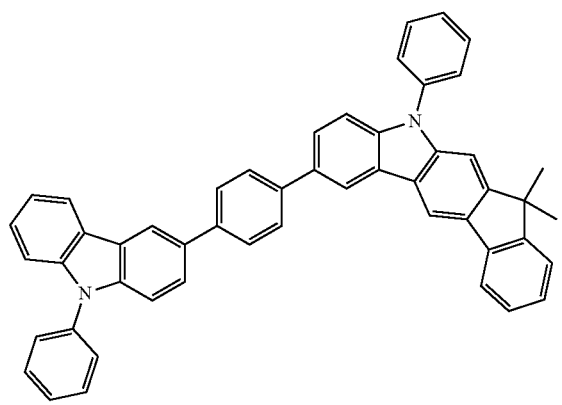 [SMILES: CC1(C)c2ccccc2-c2cc3c4cc(-c5ccc(-c6ccc7c(c6)c6ccccc6n7-c6ccccc6)cc5)ccc4n(-c4ccccc4)c3cc21]
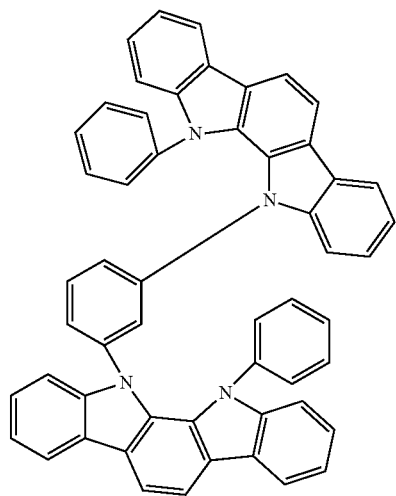 [SMILES: c1ccc(-n2c3ccccc3c3ccc4c5ccccc5n(-c5cccc(-n6c7ccccc7c7ccc8c9ccccc9n(-c9ccccc9)c8c76)c5)c4c32)cc1]
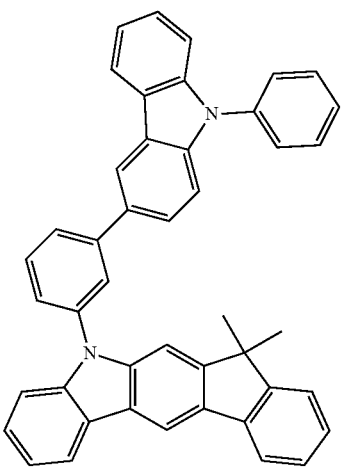 [SMILES: CC1(C)c2ccccc2-c2cc3c4ccccc4n(-c4cccc(-c5ccc6c(c5)c5ccccc5n6-c5ccccc5)c4)c3cc21]

-continued
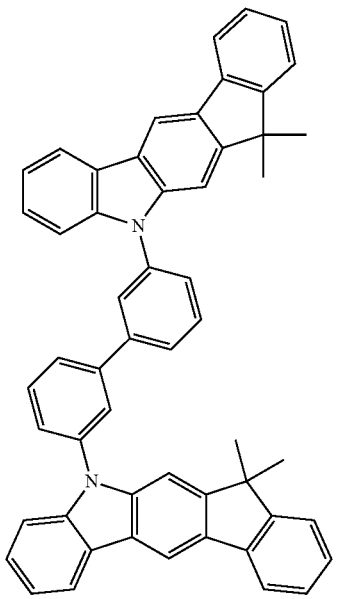 [SMILES: CC1(C)c2ccccc2-c2cc3c4ccccc4n(-c4cccc(-c5cccc(-n6c7ccccc7c7cc8c(cc76)C(C)(C)c6ccccc6-8)c5)c4)c3cc21]
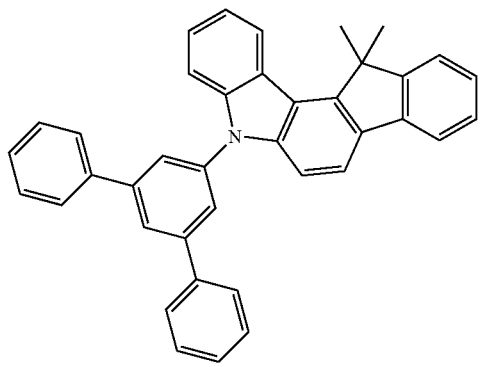 [SMILES: CC1(C)c2ccccc2-c2ccc3c(c21)c1ccccc1n3-c1cc(-c2ccccc2)cc(-c2ccccc2)c1]
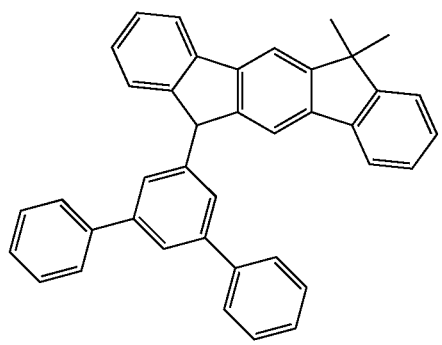 [SMILES: CC1(C)c2ccccc2-c2cc3c(cc21)-c1ccccc1C3c1cc(-c2ccccc2)cc(-c2ccccc2)c1]
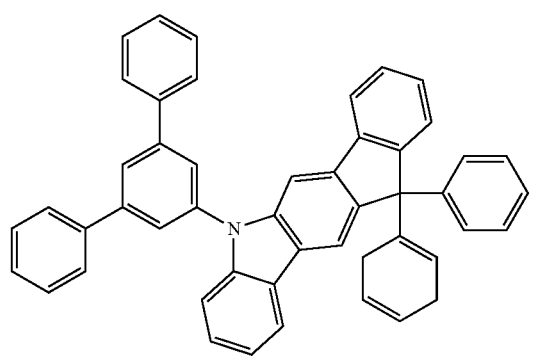 [SMILES: C1=CCC(C2(c3ccccc3)c3ccccc3-c3cc4c(cc32)c2ccccc2n4-c2cc(-c3ccccc3)cc(-c3ccccc3)c2)=CC1]
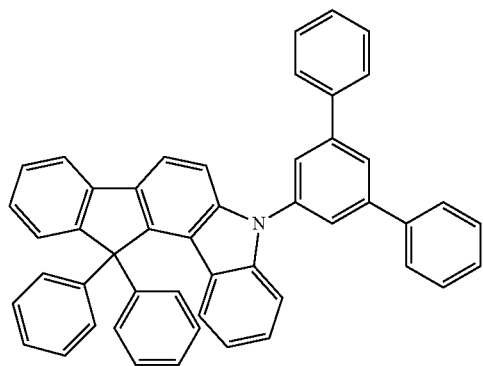 [SMILES: c1ccc(-c2cc(-c3ccccc3)cc(-n3c4ccccc4c4c5c(ccc43)-c3ccccc3C5(c3ccccc3)c3ccccc3)c2)cc1]
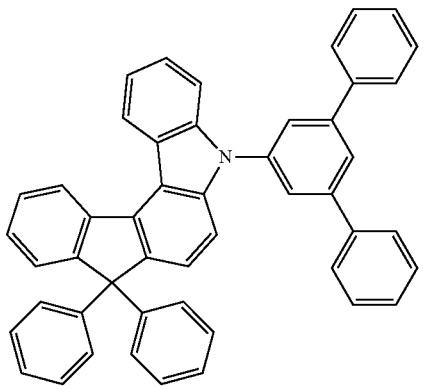 [SMILES: c1ccc(-c2cc(-c3ccccc3)cc(-n3c4ccccc4c4c5c(ccc43)C(c3ccccc3)(c3ccccc3)c3ccccc3-5)c2)cc1]

-continued
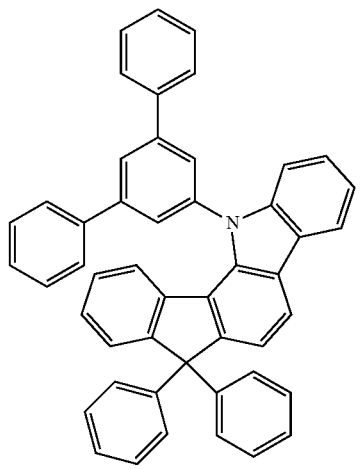 [SMILES: c1ccc(-c2cc(-c3ccccc3)cc(-n3c4ccccc4c4ccc5c(c43)-c3ccccc3C5(c3ccccc3)c3ccccc3)c2)cc1]
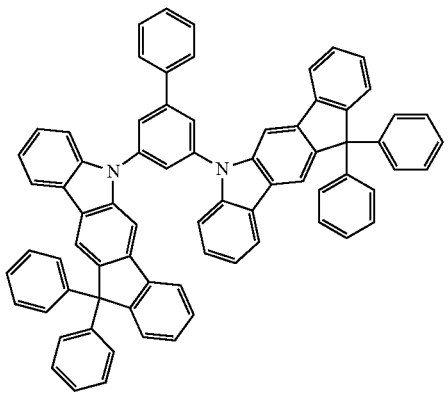 [SMILES: c1ccc(-c2cc(-n3c4ccccc4c4cc5c(cc43)-c3ccccc3C5(c3ccccc3)c3ccccc3)cc(-n3c4ccccc4c4cc5c(cc43)-c3ccccc3C5(c3ccccc3)c3ccccc3)c2)cc1]
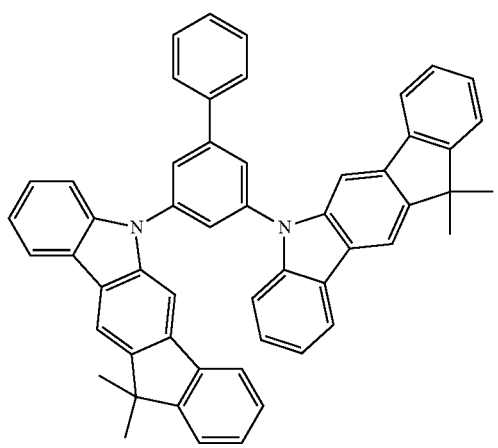 [SMILES: CC1(C)c2ccccc2-c2cc3c(cc21)c1ccccc1n3-c1cc(-c2ccccc2)cc(-n2c3ccccc3c3cc4c(cc32)-c2ccccc2C4(C)C)c1]
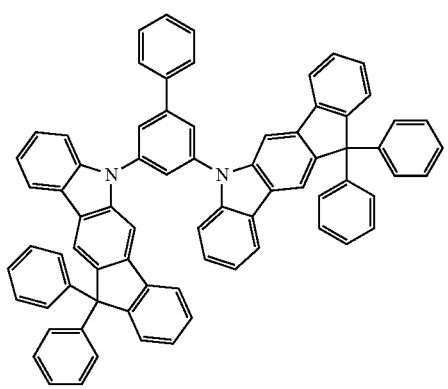 [SMILES: c1ccc(-c2cc(-n3c4ccccc4c4cc5c(cc43)-c3ccccc3C5(c3ccccc3)c3ccccc3)cc(-n3c4ccccc4c4cc5c(cc43)-c3ccccc3C5(c3ccccc3)c3ccccc3)c2)cc1]
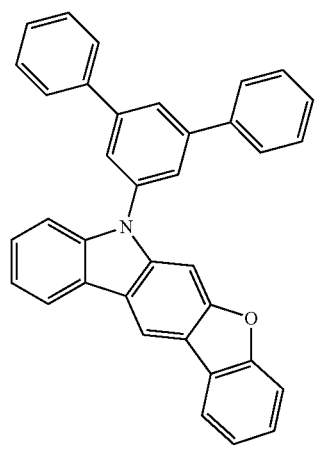 [SMILES: c1ccc(-c2cc(-c3ccccc3)cc(-n3c4ccccc4c4cc5c(cc43)oc3ccccc35)c2)cc1]
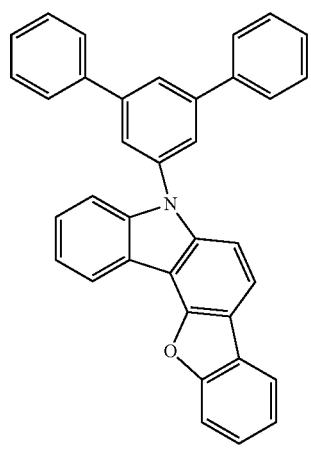 [SMILES: c1ccc(-c2cc(-c3ccccc3)cc(-n3c4ccccc4c4c5oc6ccccc6c5ccc43)c2)cc1]

-continued

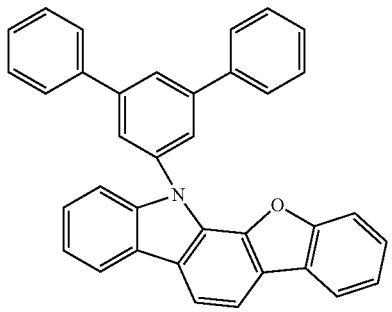 [SMILES: c1ccc(-c2cc(-c3ccccc3)cc(-n3c4ccccc4c4ccc5c6ccccc6oc5c43)c2)cc1]
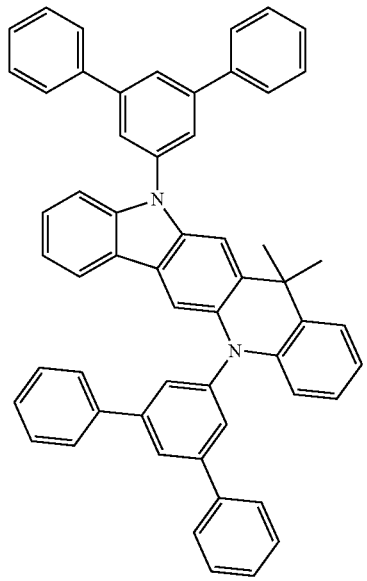 [SMILES: CC1(C)c2ccccc2N(c2cc(-c3ccccc3)cc(-c3ccccc3)c2)c2cc3c4ccccc4n(-c4cc(-c5ccccc5)cc(-c5ccccc5)c4)c3cc21]
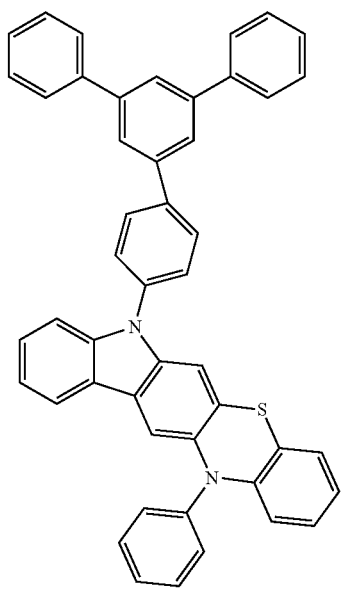 [SMILES: c1ccc(-c2cc(-c3ccccc3)cc(-c3ccc(-n4c5ccccc5c5cc6c(cc54)Sc4ccccc4N6c4ccccc4)cc3)c2)cc1]
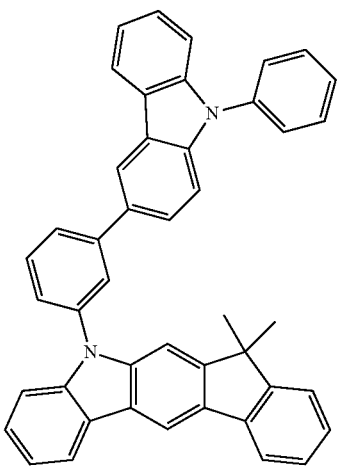 [SMILES: CC1(C)c2ccccc2-c2cc3c4ccccc4n(-c4cccc(-c5ccc6c(c5)c5ccccc5n6-c5ccccc5)c4)c3cc21]

The organic electroluminescent device is described in greater detail below.

The organic electroluminescent device comprises cathode, anode and an emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. However, it should be pointed out that each of these layers does not necessarily have to be present.

In the other layers of the organic electroluminescent device according to the invention, in particular in the hole-injection and -transport layers and in the electron-injection and -transport layers, use can be made of all materials as are usually employed in accordance with the prior art. The hole-transport layers here may also be p-doped and the electron-transport layers may also be n-doped. A p-doped layer here is taken to mean a layer in which free holes are generated and whose conductivity has thereby been increased. A comprehensive discussion of doped transport layers in OLEDs can be found in Chem. Rev. 2007, 107, 1233. The p-dopant is particularly preferably capable of oxidising the hole-transport material in the hole-transport layer, i.e. has a sufficiently high redox potential, in particular a higher redox potential than the hole-transport material. Suitable dopants are in principle all compounds which are electron-acceptor compounds and are able to increase the conductivity of the organic layer by oxidation of the host. The person skilled in the art will be able to identify suitable compounds without major effort on the basis of his general expert knowledge. Particularly suitable dopants are the compounds disclosed in WO 2011/073149, EP 1968131, EP 2276085, EP 2213662, EP 1722602, EP 2045848, DE 102007031220, U.S. Pat. Nos. 8,044,390, 8,057,712, WO 2009/003455, WO 2010/094378, WO 2011/120709 and US 2010/0096600.

The person skilled in the art will therefore be able to employ, without inventive step, all materials known for organic electroluminescent devices in combination with the emitting layer according to the invention.

The cathode preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). Furthermore suitable are alloys of an alkali metal or alkaline-earth metal and silver, for example an alloy of magnesium and silver. In the case of multilayered structures, further metals which have a relatively high work function, such as, for example, Ag, may also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent or partially transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it is also possible for the pressure to be even lower, for example less than $10^{-7}$ mbar.

Preference is likewise given to an organic electroluminescent device, characterised in that one or more layers are applied by means of the OVPD (organic vapour-phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett*, 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), ink-jet printing or nozzle printing. Soluble compounds are necessary for this purpose, which are obtained, for example, by suitable substitution. These processes are also suitable, in particular, for oligomers, dendrimers and polymers.

These processes are generally known to the person skilled in the art and can be applied by him without inventive step to organic electroluminescent devices comprising the compounds according to the invention.

The present invention therefore furthermore relates to a process for the production of an organic electroluminescent device according to the invention, characterised in that at least one layer is applied by means of a sublimation process and/or in that at least one layer is applied by means of an OVPD (organic vapour phase deposition) process or with the aid of carrier-gas sublimation and/or in that at least one layer is applied from solution, by spin coating or by means of a printing process.

The organic electroluminescent devices according to the invention are distinguished over the prior art by one or more of the following surprising advantages:

1. The organic electroluminescent devices according to the invention have very good efficiency which is improved compared with devices in accordance with the prior art which likewise exhibit TADF.
2. The organic electroluminescent devices according to the invention have a very low voltage.
3. The organic electroluminescent devices according to the invention have a very good lifetime which is improved compared with devices in accordance with the prior art which likewise exhibit TADF.
4. The organic electroluminescent devices according to the invention have improved roll-off behaviour, i.e a smaller drop in the efficiency at high luminous densities.
5. Compared with organic electroluminescent devices in accordance with the prior art which comprise iridium or platinum complexes as emitter compounds, the electroluminescent devices according to the invention have an improved lifetime at elevated temperature.

These above-mentioned advantages are not accompanied by a worsening of the other electronic properties.

The invention is explained in greater detail by the following examples without wishing to restrict it thereby. The person skilled in the art will be able to carry out the invention throughout the range disclosed on the basis of the descriptions and produce further organic electroluminescent devices according to the invention without inventive step.

EXAMPLES

Determination of HOMO, LUMO, Singlet and Triplet Level

The HOMO and LUMO energy levels and the energy of the lowest triplet state $T_1$ or of the lowest excited singlet state $S_1$ of the materials are determined via quantum-chemical calculations. To this end, the "Gaussian09W" software package (Gaussian Inc.) is used. In order to calculate organic substances without metals (denoted by "org." method in Table 4), firstly a geometry optimisation is carried out using the "Ground State/Semi-empirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For metal-containing compounds (denoted by "organom." method in Table 4), the geometry is optimised via the "Ground State/Hartree-Fock/Default Spin/LanL2MB/Charge 0/Spin Singlet" method. The energy calculation is carried out analogously to the organic substances as described above, with the difference that the "LanL2DZ"

base set is used for the metal atom and the "6-31G(d)" base set is used for the ligands. The energy calculation gives the HOMO energy level HEh or LUMO energy level LEh in hartree units. The HOMO and LUMO energy levels calibrated with reference to cyclic voltammetry measurements are determined therefrom in electron volts as follows:

HOMO(eV)=((HEh*27.212)−0.9899)/1.1206

LUMO(eV)=((LEh*27.212)−2.0041)/1.385

These values are to be regarded in the sense of this application as HOMO and LUMO energy levels of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

Table 4 below shows the HOMO and LUMO energy levels and $S_1$ and $T_1$ of the various materials.

Determination of the PL Quantum Efficiency (PLQE)

A 50 nm thick film of the emission layers used in the various OLEDs is applied to a suitable transparent substrate, preferably quartz, i.e. the layer comprises the same materials in the same concentration as the OLED. The same production conditions are used here as in the production of the emission layer for the OLEDs. An absorption spectrum of this film is measured in the wavelength range from 350-500 nm. To this end, the reflection spectrum $R(\lambda)$ and the transmission spectrum $T(\lambda)$ of the sample are determined at an angle of incidence of 6° (i.e. virtually perpendicular incidence). The absorption spectrum in the sense of this application is defined as $A(\lambda)=1-R(\lambda)-T(\lambda)$.

If $A(\lambda) \leq 0.3$ in the range 350-500 nm, the wavelength belonging to the maximum of the absorption spectrum in the range 350-500 nm is defined as $\lambda_{exc}$. If $A(\lambda)>0.3$ for any wavelength, the greatest wavelength at which $A(\lambda)$ changes from a value less than 0.3 to a value greater than 0.3 or from a value greater than 0.3 to a value less than 0.3 is defined as $\lambda_{exc}$.

The PLQE is determined using a Hamamatsu C9920-02 measurement system. The principle is based on excitation of the sample by light of defined wavelength and measurement of the absorbed and emitted radiation. The sample is located in an Ulbricht sphere ("integrating sphere") during measurement. The spectrum of the excitation light is approximately Gaussian with a full width at half maximum of <10 nm and a peak wavelength $\lambda_{exc}$ as defined above. The PLQE is determined by the evaluation method which is usual for the said measurement system. It is vital to ensure that the sample does not come into contact with oxygen at any time, since the PLQE of materials having a small energetic separation between $S_1$ and $T_1$ is reduced very considerably by oxygen (H. Uoyama et al., Nature 2012, Vol. 492, 234).

Table 2 shows the PLQE for the emission layers of the OLEDs as defined above together with the excitation wavelength used.

Determination of the Decay Time

The decay time is determined using a sample produced as described above under "Determination of the PL quantum efficiency (PLQE)". The sample is excited at a temperature of 295 K by a laser pulse (wavelength 266 nm, pulse duration 1.5 ns, pulse energy 200 µJ, ray diameter 4 mm). The sample is located in a vacuum (<$10^{-5}$ mbar) here. After the excitation (defined as t=0), the change in the intensity of the emitted photoluminescence over time is measured. The photoluminescence exhibits a steep drop at the beginning, which is attributable to the prompt fluorescence of the TADF compound. As time continues, a slower drop is observed, the delayed fluorescence (see, for example, H. Uoyama et al., Nature, vol. 492, no. 7428, pp. 234-238, 2012 and K. Masui et al., Organic Electronics, vol. 14, no. 11, pp. 2721-2726, 2013). The decay time $t_a$ in the sense of this application is the decay time of the delayed fluorescence and is determined as follows: a time $t_d$ is selected at which the prompt fluorescence has decayed significantly below the intensity of the delayed fluorescence (<1%), so that the following determination of the decay time is not influenced thereby. This choice can be made by a person skilled in the art. For the measurement data from time $t_d$, the decay time $t_a=t_e-t_d$ is determined. $t_e$ here is the time after $t=t_d$ at which the intensity has for the first time dropped to 1/e of its value at $t=t_d$.

Table 2 shows the values of $t_a$ and $t_d$ which are determined for the emission layers of the OLEDs according to the invention.

Examples

Production of the OLEDs

The data of various OLEDs are presented in Examples V1 to E17 below (see Tables 1 and 2).

Glass plates coated with structured ITO (indium tin oxide) in a thickness of 50 nm form the substrates for the OLEDs. The substrates are wet-cleaned (dishwasher, Merck Extran detergent), subsequently dried by heating at 250° C. for 15 min and treated with an oxygen plasma for 130 s before the coating. These plasma-treated glass plates form the substrates to which the OLEDs are applied. The substrates remain in vacuo before the coating. The coating begins at the latest 10 min after the plasma treatment.

The OLEDs have in principle the following layer structure: substrate/hole-injection layer (HIL)/hole-transport layer (HTL)/optional interlayer (IL)/electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The precise structure of the OLEDs is shown in Table 2. The materials required for the production of the OLEDs are shown in Table 3.

All materials are applied by thermal vapour deposition in a vacuum chamber. The emission layer here always consists of a matrix material (host material) and the emitting TADF compound, i.e. the material which exhibits a small energetic difference between $S_1$ and $T_1$. This is admixed with the matrix material in a certain proportion by volume by co-evaporation. An expression such as IC1:D1 (95%:5%) here means that material IC1 is present in the layer in a proportion by volume of 95% and D1 is present in the layer in a proportion of 5%. Analogously, the electron-transport layer may also consist of a mixture of two materials.

The OLEDs are characterised by standard methods. For this purpose, the electroluminescence spectra, the current efficiency (measured in cd/A), the power efficiency (measured in lm/W) and the external quantum efficiency (EQE, measured in percent) as a function of the luminous density, calculated from current/voltage/luminous density characteristic lines (IUL characteristic lines) assuming Lambert emission characteristics, and the lifetime are determined. The electroluminescence spectra are determined at a luminous density of 1000 cd/m$^2$, and the CIE 1931 x and y colour coordinates are calculated therefrom. The term U1000 in Table 2 denotes the voltage required for a luminous density of 1000 cd/m². CE1000 and PE1000 denote the current and power efficiency respectively which are achieved at 1000 cd/m². Finally, EQE1000 denotes the external quantum efficiency at an operating luminous density of 1000 cd/m².

The roll-off is defined as EQE at 5000 cd/m² divided by EQE at 500 cd/m², i.e. a high value corresponds to a small drop in the efficiency at high luminous densities, which is advantageous.

The lifetime LT is defined as the time after which the luminous density drops from the initial luminous density to a certain proportion L1 on operation at constant current. An expression of j0=10 mA/cm², L1=80% in Table 2 means that the luminous density drops to 80% of its initial value after time LT on operation at 10 mA/cm².

The emitting dopant employed in the emission layer is compound D1, which has an energetic separation between $S_1$ and $T_1$ of 0.09 eV, or compound D2, for which the difference between $S_1$ and $T_1$ is 0.06 eV The data for the various OLEDs are summarised in Table 2. Examples V1-V10 are comparative examples in accordance with the prior art, Examples E1-E17 show data of OLEDs according to the invention.

Some of the examples are explained in greater detail below in order to illustrate the advantages of the compounds according to the invention.

However, it should be pointed out that this only represents a selection of the data shown in Table 2.

As can be seen from the table, significant improvements with respect to voltage and efficiency are obtained with emission layers according to the invention, resulting in a significant improvement in the power efficiency. For example, a 0.6 V low operating voltage, an approx. 45% better quantum efficiency and an about 70% better power efficiency are obtained with compound IC1 compared with CBP, and at the same time the roll-of improves significantly from 0.60 to 0.72 (Examples V2, E2).

Furthermore, significantly better lifetimes of the OLEDs are obtained with emission layers according to the invention. Compared with CBP as matrix material, the lifetime increases by about 80% on use of IC1 (Examples V2, E2), and even by 140% on use of IC5 in the same structure (Examples V2, E4).

TABLE 1

Structure of the OLEDs

| Ex. | HIL Thickness | HTL Thickness | IL Thickness | EBL Thickness | EML Thickness | HBL Thickness | ETL Thickness | EIL Thickness |
|---|---|---|---|---|---|---|---|---|
| V1 | HAT 5 nm | SpA1 70 nm | HAT 5 nm | SpMA1 20 nm | CBP:D1 (95%:5%) 15 nm | — | ST2:LiQ (50%:50%) 50 nm | — |
| V2 | HAT 5 nm | SpA1 70 nm | HAT 5 nm | SpMA1 20 nm | CBP:D1 (95%:5%) 15 nm | IC1 10 nm | ST2:LiQ (50%:50%) 40 nm | — |
| V3 | HAT 5 nm | SpA1 70 nm | HAT 5 nm | SpMA1 20 nm | BCP:D1 (95%:5%) 15 nm | IC1 10 nm | ST2 40 nm | LiQ 3 nm |
| V4 | HAT 5 nm | SpA1 70 nm | HAT 5 nm | SpMA1 20 nm | BCP:D1 (95%:5%) 15 nm | BCP 10 nm | ST2 40 nm | LiQ 3 nm |
| V5 | HAT 5 nm | SpA1 70 nm | HAT 5 nm | SpMA1 20 nm | BCP:D1 (95%:5%) 15 nm | IC5 10 nm | ST2 40 nm | LiQ 3 nm |
| V6 | HAT 5 nm | SpA1 70 nm | HAT 5 nm | SpMA1 20 nm | CBP:D1 (95%:5%) 30 nm | IC1 10 nm | ST2 40 nm | LiQ 3 nm |
| V7 | SpMA1:F4T (95%:5%) 10 nm | SpMA1 80 nm | — | IC2 10 nm | CBP:D1 (95%:5%) 15 nm | IC1 10 nm | ST2:LiQ (50%:50%) 40 nm | — |
| V8 | — | — | — | SpMA1 90 nm | CBP:D2 (95%:5%) 15 nm | IC1 10 nm | ST2 45 nm | LiQ 3 nm |
| V9 | — | — | — | SpMA1 90 nm | CBP:D2 (95%:5%) 15 nm | IC1 10 nm | TPBI 45 nm | LiQ 3 nm |
| V10 | — | — | — | SpMA1 90 nm | CBP:D2 (90%:10%) 15 nm | IC1 10 nm | ST2 45 nm | LiQ 3 nm |
| E1 | HAT 5 nm | SpA1 70 nm | HAT 5 nm | SpMA1 20 nm | IC1:D1 (95%:5%) 15 nm | — | ST2:LiQ (50%:50%) 50 nm | — |
| E2 | HAT 5 nm | SpA1 70 nm | HAT 5 nm | SpMA1 20 nm | IC1:D1 (95%:5%) 15 nm | IC1 10 nm | ST2:LiQ (50%:50%) 40 nm | — |
| E3 | HAT 5 nm | SpA1 70 nm | HAT 5 nm | SpMA1 20 nm | IC5:D1 (95%:5%) 15 nm | — | ST2:LiQ (50%:50%) 50 nm | — |
| E4 | HAT 5 nm | SpA1 70 nm | HAT 5 nm | SpMA1 20 nm | IC5:D1 (95%:5%) 15 nm | IC1 10 nm | ST2:LiQ (50%:50%) 40 nm | — |
| E5 | HAT 5 nm | SpA1 70 nm | HAT 5 nm | SpMA1 20 nm | IC1:D1 (95%:5%) 15 nm | IC1 10 nm | ST2 40 nm | LiQ 3 nm |
| E6 | HAT 5 nm | SpA1 70 nm | HAT 5 nm | SpMA1 20 nm | IC1:D1 (95%:5%) 15 nm | BCP 10 nm | ST2 40 nm | LiQ 3 nm |
| E7 | HAT 5 nm | SpA1 70 nm | HAT 5 nm | SpMA1 20 nm | IC1:D1 (95%:5%) 15 nm | IC5 10 nm | ST2 40 nm | LiQ 3 nm |
| E8 | HAT 5 nm | SpA1 70 nm | HAT 5 nm | SpMA1 20 nm | IC1:D1 (95%:5%) 30 nm | IC1 10 nm | ST2 40 nm | LiQ 3 nm |
| E9 | SpMA1:F4T (95%:5%) 10 nm | SpMA1 80 nm | — | IC2 10 nm | IC1:D1 (95%:5%) 15 nm | IC1 10 nm | ST2:LiQ (50%:50%) 40 nm | — |

TABLE 1-continued

Structure of the OLEDs

| Ex. | HIL Thickness | HTL Thickness | IL Thickness | EBL Thickness | EML Thickness | HBL Thickness | ETL Thickness | EIL Thickness |
|---|---|---|---|---|---|---|---|---|
| E10 | HAT 5 nm | SpA1 70 nm | HAT 5 nm | SpMA1 20 nm | IC3:D1 (95%:5%) 15 nm | IC1 10 nm | ST2:LiQ (50%:50%) 40 nm | — |
| E11 | HAT 5 nm | SpA1 70 nm | HAT 5 nm | SpMA1 20 nm | IC4:D1 (95%:5%) 15 nm | IC1 10 nm | ST2:LiQ (50%:50%) 40 nm | — |
| E12 | — | — | — | SpMA1 90 nm | IC1:D2 (95%:5%) 15 nm | IC1 10 nm | ST2 45 nm | LiQ 3 nm |
| E13 | — | — | — | SpMA1 90 nm | IC1:D2 (95%:5%) 15 nm | IC1 10 nm | TPBI 45 nm | LiQ 3 nm |
| E14 | — | — | — | SpMA1 90 nm | IC1:D2 (95%:10%) 15 nm | IC1 10 nm | ST2 45 nm | LiQ 3 nm |
| E15 | — | — | — | SpMA1 90 nm | IC6:D2 (95%:5%) 15 nm | IC1 10 nm | ST2 45 nm | LiQ 3 nm |
| E16 | — | — | — | SpMA1 90 nm | IC6:D2 (95%:5%) 15 nm | IC1 10 nm | TPBI 45 nm | LiQ 3 nm |
| E17 | — | — | — | SpMA1 90 nm | IC6:D2 (90%:10%) 15 nm | IC1 10 nm | ST2 45 nm | LiQ 3 nm |

TABLE 2

Data of the OLEDs

| Ex | U1000 (V) | CE1000 (cd/A) | PE1000 (lm/W) | EQE 1000 | CIE x/y at 1000 cd/m$^2$ | Roll-off | L0; j0 | L1 % | LT (h) | PLQE % | $\lambda_{exc}$ nm | $t_d$ μs | $t_e$ μs |
|---|---|---|---|---|---|---|---|---|---|---|---|---|---|
| V1 | 5.3 | 8.2 | 4.9 | 2.6% | 0.27/0.58 | 0.43 | 10 mA/cm$^2$ | 90 | 107 | 100 | 350 | 7 | 4.5 |
| V2 | 4.2 | 44 | 33 | 14.1% | 0.25/0.58 | 0.60 | 10 mA/cm$^2$ | 80 | 23 | 100 | 350 | 7 | 4.5 |
| V3 | 6.7 | 4.9 | 2.3 | 1.6% | 0.26/0.56 | 0.65 | 10 mA/cm$^2$ | 80 | 1 | 59 | 350 | 6 | 5.9 |
| V4 | 7.8 | 4.2 | 1.7 | 1.4% | 0.27/0.55 | 0.63 | 10 mA/cm$^2$ | 80 | 1 | 59 | 350 | 6 | 5.9 |
| V5 | 6.8 | 4.3 | 2.0 | 1.4% | 0.27/0.54 | 0.53 | 10 mA/cm$^2$ | 80 | 1 | 59 | 350 | 6 | 5.9 |
| V6 | 5.1 | 44 | 27 | 13.6% | 0.27/0.58 | 0.73 | 10 mA/cm$^2$ | 80 | 21 | 100 | 350 | 7 | 4.5 |
| V7 | 4.1 | 49 | 38 | 15.4% | 0.27/0.58 | 0.63 | 10 mA/cm$^2$ | 80 | 34 | 100 | 350 | 7 | 4.5 |
| V8 | 8.1 | 20 | 7.6 | 6.7% | 0.49/0.49 | 0.64 | 10 mA/cm$^2$ | 80 | 14 | 43 | 350 | 6 | 5.1 |
| V9 | 9.2 | 12.5 | 4.3 | 4.7% | 0.49/0.47 | 0.72 | 10 mA/cm$^2$ | 80 | 5 | 43 | 350 | 6 | 5.1 |
| V10 | 8.1 | 14.6 | 5.7 | 6.3% | 0.54/0.45 | 0.71 | 10 mA/cm$^2$ | 80 | 25 | 35 | 350 | 5 | 4.9 |
| E1 | 4.3 | 18.7 | 13.7 | 5.9% | 0.26/0.58 | 0.69 | 10 mA/cm$^2$ | 90 | 131 | 92 | 350 | 7 | 5.4 |
| E2 | 3.6 | 65 | 56 | 20.8% | 0.25/0.58 | 0.72 | 10 mA/cm$^2$ | 80 | 44 | 92 | 350 | 7 | 5.4 |
| E3 | 4.3 | 12.1 | 8.9 | 3.8% | 0.33/0.58 | 0.67 | 10 mA/cm$^2$ | 90 | 178 | 57 | 350 | 4 | 4.0 |
| E4 | 3.5 | 43 | 39 | 13.3% | 0.32/0.58 | 0.66 | 10 mA/cm$^2$ | 80 | 63 | 57 | 350 | 4 | 4.0 |
| E5 | 3.3 | 67 | 64 | 21.0% | 0.26/0.58 | 0.79 | 10 mA/cm$^2$ | 80 | 28 | 92 | 350 | 7 | 5.4 |
| E6 | 4.1 | 17.2 | 13.2 | 5.4% | 0.26/0.58 | 0.69 | 10 mA/cm$^2$ | 80 | 12 | 92 | 350 | 7 | 5.4 |
| E7 | 3.2 | 56 | 56 | 17.6% | 0.27/0.58 | 0.75 | 10 mA/cm$^2$ | 80 | 22 | 92 | 350 | 7 | 5.4 |
| E8 | 3.9 | 65 | 53 | 20.1% | 0.27/0.59 | 0.79 | 10 mA/cm$^2$ | 80 | 30 | 92 | 350 | 7 | 5.4 |
| E9 | 3.6 | 68 | 59 | 21.5% | 0.26/0.58 | 0.73 | 10 mA/cm$^2$ | 80 | 52 | 92 | 350 | 7 | 5.4 |
| E10 | 3.2 | 52 | 52 | 15.7% | 0.31/0.60 | 0.71 | 10 mA/cm$^2$ | 80 | 88 | 77 | 350 | 7 | 7.0 |
| E11 | 3.9 | 48 | 38 | 14.6% | 0.27/0.59 | 0.61 | 10 mA/cm$^2$ | 80 | 38 | 84 | 359 | 7 | 4.2 |
| E12 | 5.3 | 27 | 16 | 9.6% | 0.51/0.48 | 0.80 | 10 mA/cm$^2$ | 80 | 69 | 41 | 350 | 7 | 4.6 |
| E13 | 7.0 | 15.0 | 6.7 | 5.6% | 0.50/0.48 | 0.84 | 10 mA/cm$^2$ | 80 | 15 | 41 | 350 | 7 | 4.6 |
| E14 | 5.9 | 16.2 | 8.6 | 7.3% | 0.55/0.44 | 0.80 | 10 mA/cm$^2$ | 80 | 95 | 33 | 350 | 6 | 6.2 |
| E15 | 8.1 | 14.4 | 5.6 | 5.8% | 0.52/0.46 | 0.77 | 10 mA/cm$^2$ | 80 | 68 | 37 | 350 | 6 | 5.3 |
| E16 | 9.2 | 10.5 | 3.6 | 4.3% | 0.51/0.46 | 0.81 | 10 mA/cm$^2$ | 80 | 26 | 37 | 350 | 6 | 5.3 |
| E17 | 8.0 | 12.7 | 5.0 | 5.7% | 0.54/0.44 | 0.80 | 10 mA/cm$^2$ | 80 | 76 | 29 | 350 | 6 | 5.0 |

TABLE 3
Structural formula of the materials for the OLEDs
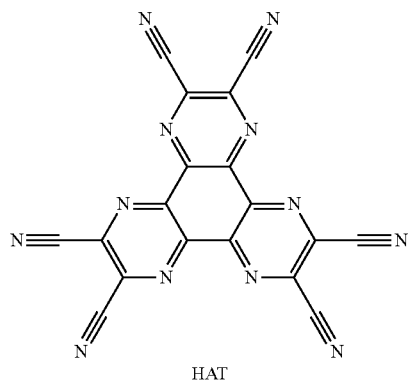
HAT
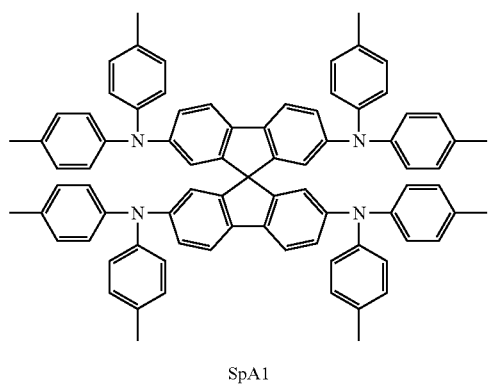
SpA1
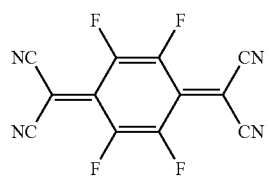 [SMILES: N#CC(C#N)=c1c(F)c(F)c(=C(C#N)C#N)c(F)c1F]
F4T
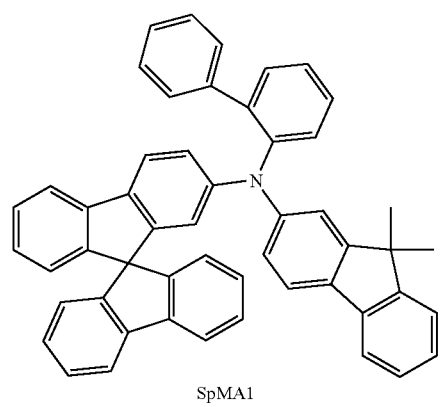
SpMA1
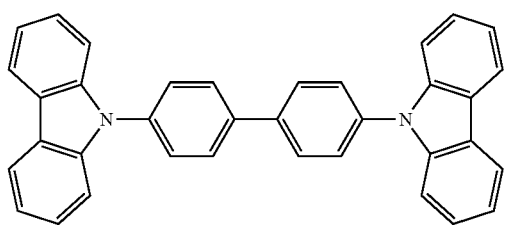 [SMILES: c1ccc2c(c1)c1ccccc1n2-c1ccc(-c2ccc(-n3c4ccccc4c4ccccc43)cc2)cc1]
CBP
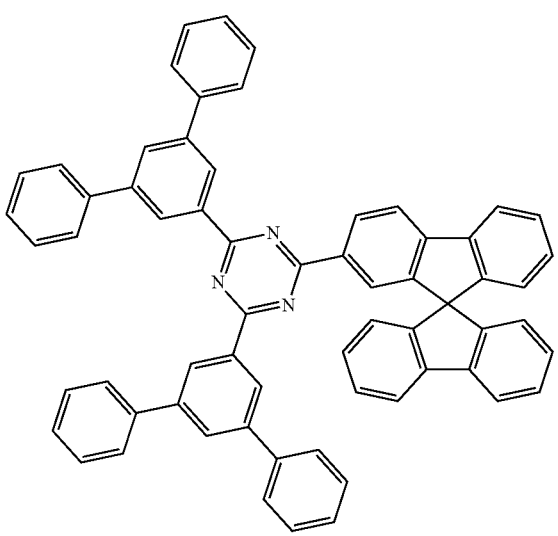 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
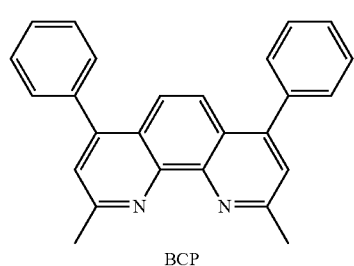
BCP
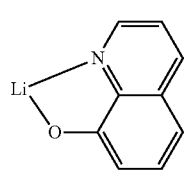
LiQ TABLE 3-continued
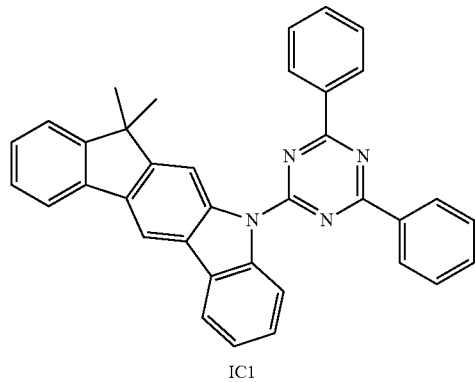
IC1
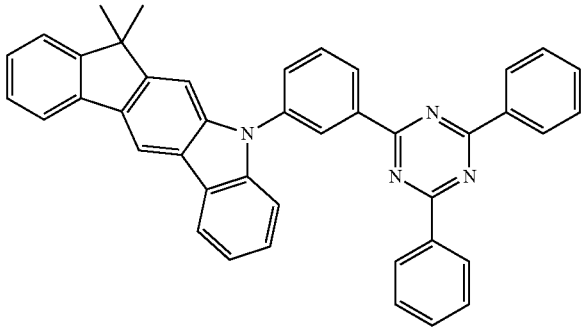 [SMILES: CC1(C)c2ccccc2-c2cc3c4ccccc4n(-c4cccc(-c5nc(-c6ccccc6)nc(-c6ccccc6)n5)c4)c3cc21]
IC5
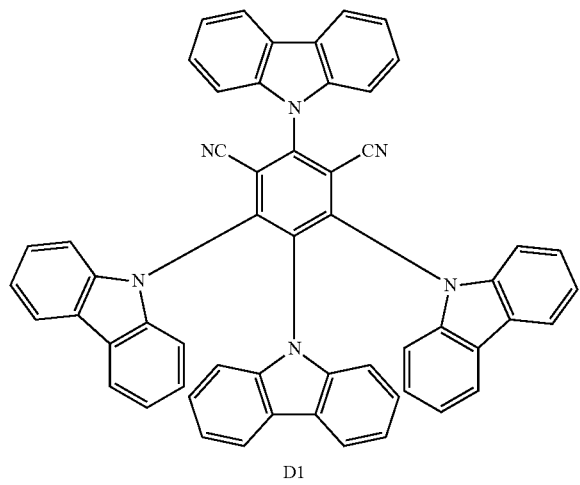
D1
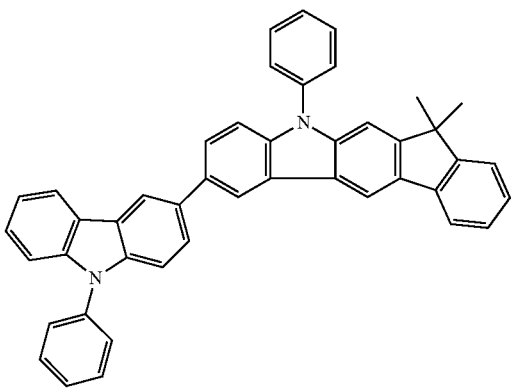 [SMILES: CC1(C)c2ccccc2-c2cc3c4cc(-c5ccc6c(c5)c5ccccc5n6-c5ccccc5)ccc4n(-c4ccccc4)c3cc21]
IC2
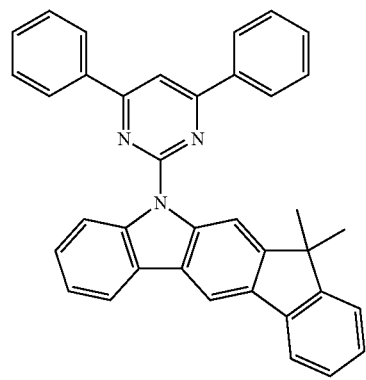 [SMILES: CC1(C)c2ccccc2-c2cc3c4ccccc4n(-c4nc(-c5ccccc5)cc(-c5ccccc5)n4)c3cc21]
IC3
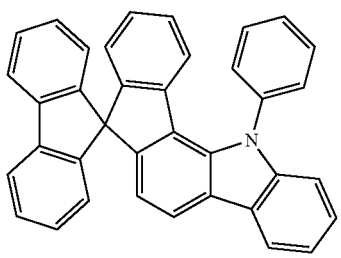 [SMILES: c1ccc(-n2c3ccccc3c3ccc4c(c32)-c2ccccc2C42c3ccccc3-c3ccccc32)cc1]
IC4

TABLE 3-continued

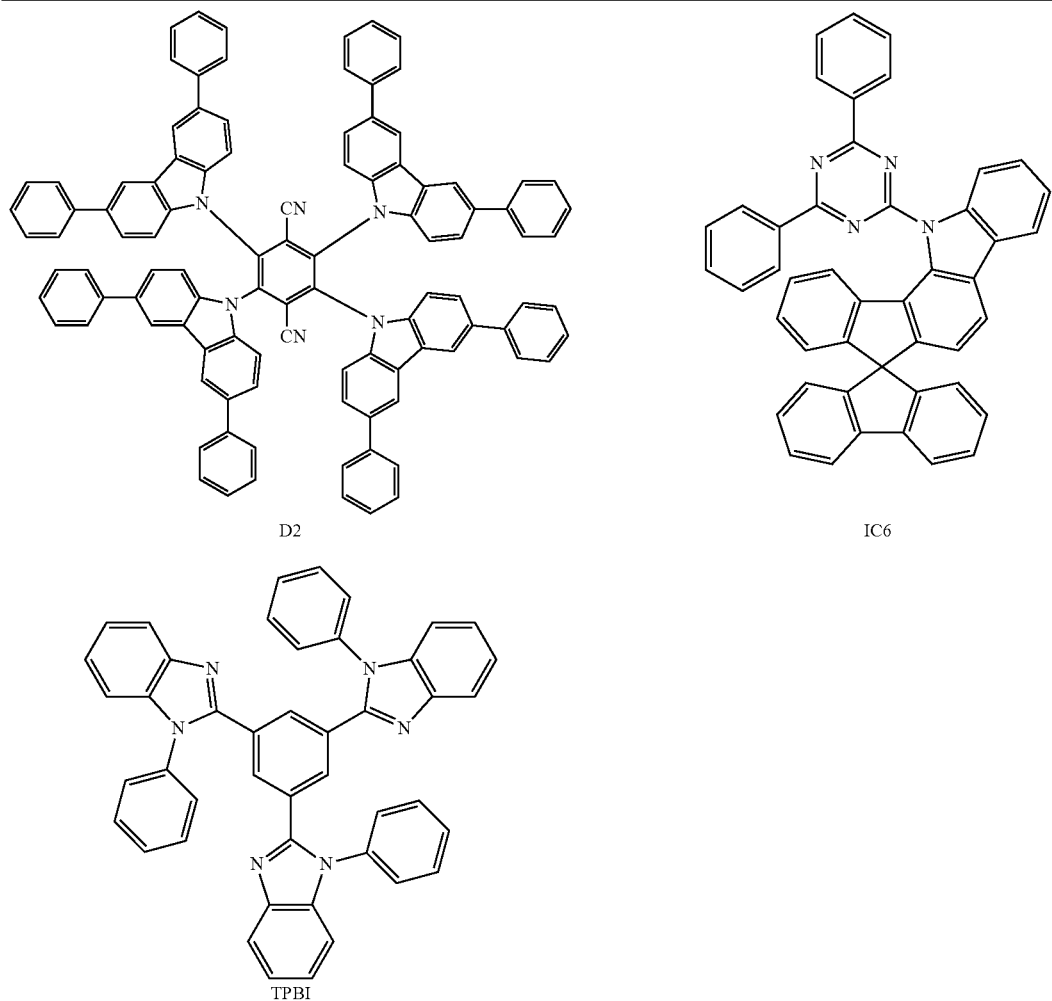

TABLE 4

HOMO, LUMO, $T_1$, $S_1$ of the relevant materials

| Material | Method | HOMO (eV) | LUMO (eV) | $S_1$ (eV) | $T_1$ (eV) |
|---|---|---|---|---|---|
| D1 | org. | −6.11 | −3.40 | 2.50 | 2.41 |
| D2 | org. | −5.92 | −3.61 | 2.09 | 2.03 |
| CBP | org. | −5.67 | −2.38 | 3.59 | 3.11 |
| BCP | org. | −6.15 | −2.44 | 3.61 | 2.70 |
| IC1 | org. | −5.79 | −2.83 | 3.09 | 2.69 |
| IC5 | org. | −5.56 | −2.87 | 2.87 | 2.72 |
| IC4 | org. | −5.74 | −2.23 | 3.59 | 2.72 |
| IC3 | org. | −5.62 | −2.75 | 3.02 | 2.75 |
| SpA1 | org. | −4.87 | −2.14 | 2.94 | 2.34 |
| SpMA1 | org. | −5.25 | −2.18 | 3.34 | 2.58 |
| IC2 | org. | −5.40 | −2.11 | 3.24 | 2.80 |
| HAT | org. | −8.86 | −4.93 | | |
| F4T | org. | −7.91 | −5.21 | | |
| ST2 | org. | −6.03 | −2.82 | 3.32 | 2.68 |
| LiQ | organom. | −5.17 | −2.39 | 2.85 | 2.13 |
| TPBI | org. | −6.26 | −2.48 | 3.47 | 3.04 |
| IC6 | org. | −5.87 | −2.85 | 2.72 | 3.14 |

The invention claimed is:

1. An organic electroluminescent device comprising cathode, anode and emitting layer, which consists of the following compounds:

(A) at least one luminescent organic compound which has a separation between the lowest triplet state $T_1$ and the first excited singlet state $S_1$ of ≤0.15 eV (TADF compound);

wherein the at least one TADF compound is a luminescent organic compound which is an aromatic compound which contains both donor and acceptor substituents, where the donor substituents are selected from the group consisting of diarylamino groups, heteroarylamino groups, carbazole groups and carbazole derivatives, which may in each case also be substituted, and where the acceptor substituents are selected from the group consisting of cyano groups and electron-deficient heteroaryl groups, which are optionally substituted, and which has a separation between the lowest triplet state $T_1$ and the first excited singlet state $S_1$ of <0.15 eV; and (B) at least one compound of the formula (1),

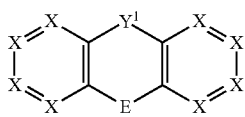

formula (1)

where the following applies to the symbols used:
X is on each occurrence, identically or differently, CR or N, or a group X-X stands for a group of the following formula (2), with the proviso that at least one group X-X stands for a group of the formula (2) and that a maximum of one group X-X per ring stands for a group of the formula (2),

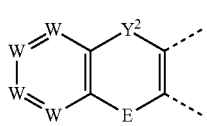

formula (2)

where the C atoms with the dashed bonds indicate the bonding of the group;
$Y^1$, $Y^2$ are selected on each occurrence, identically or differently, from the group consisting of $CR_2$, NR, O, S, $SiR_2$, BR, PR and P(=O)R;
E is selected on each occurrence, identically or differently, from the group consisting of a single bond, $CR_2$, NR, O, S, $SiR_2$, BR, PR and P(=O)R;
W is on each occurrence, identically or differently, CR or N;
R is selected on each occurrence, identically or differently, from the group consisting of H, D, F, Cl, Br, I, CN, $NO_2$, $N(Ar)_2$, $N(R^1)_2$, C(=O)Ar, C(=O)$R^1$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^1$, where one or more non-adjacent $CH_2$ groups is optionally replaced by $R^1C$=$CR^1$, C≡C, $Si(R^1)_2$, C=O, C=S, C=$NR^1$, P(=O)$(R^1)$, SO, $SO_2$, $NR^1$, O, S or $CONR^1$ and where one or more H atoms is optionally replaced by D, F, Cl, Br, I, CN or $NO_2$, an aromatic or heteroaromatic ring system having 5 to 80, which may in each case be substituted by one or more radicals R', an aryloxy or heteroaryloxy group having 5 to 60 aromatic ring atoms, which is optionally substituted by one or more radicals $R^1$, or an aralkyl or heteroaralkyl group having 5 to 60 aromatic ring atoms, which is optionally substituted by one or more radicals $R^1$, where two or more adjacent substituents R may optionally form a monocyclic or polycyclic, aliphatic, aromatic or heteroaromatic ring system, which is optionally substituted by one or more radicals $R^1$;
$R^1$ is selected on each occurrence, identically or differently, from the group consisting of H, D, F, Cl, Br, I, CN, $NO_2$, $N(Ar)_2$, $N(R^2)_2$, C(=O)Ar, C(=O)$R^2$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C$=$CR^2$, C≡C, $Si(R^2)_2$, C=O, C=S, C=$NR^2$, P(=O)$(R^2)$, SO, $SO_2$, $NR^2$, O, S or $CONR^2$ and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroalkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;
Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from $N(R^2)$, $C(R^2)_2$, O or S; and
$R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

2. The organic electroluminescent device according to claim 1, wherein the TADF compound in a layer in a mixture with the compound of the formula (1) has a luminescence quantum efficiency of at least 40%.

3. The organic electroluminescent device according to claim 1, wherein the separation between $S_1$ and $T_1$ of the TADF compound is ≤0.10 eV.

4. The organic electroluminescent device according to claim 1, wherein the following applies to the LUMO of the TADF compound LUMO(TADF) and the HOMO of the compound of the formula (1) HOMO(matrix):

LUMO(TADF)−HOMO(matrix)>S$_1$(TADF)−0.4eV, where S$_1$(TADF) is the first excited singlet state S$_1$ of the TADF compound.

5. The organic electroluminescent device according to claim 1, wherein the lowest triplet energy of the compound of the formula (1) is a maximum of 0.1 eV lower than the triplet energy of the TADF compound.

6. The organic electroluminescent device according to claim 1, wherein E is selected on each occurrence, identically or differently, from the group consisting of a single bond, $CR_2$, NR, O and S.

7. The organic electroluminescent device according to claim 1, wherein the compound of the formula (1) is selected from the compounds of the formulae (3) to (9),

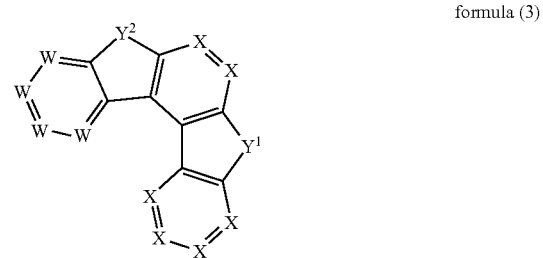

formula (3)

-continued

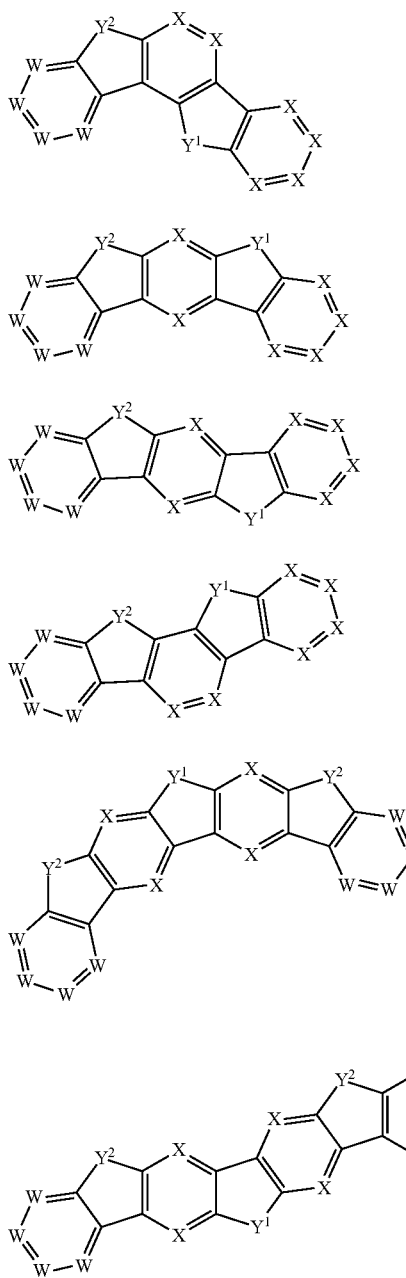

formula (4)

formula (5)

formula (6)

formula (7)

formula (8)

formula (9)

wherein W, $Y^1$, $Y^2$, R, $R^1$ and $R^2$ have the meanings given in claim 1 and furthermore:

X is on each occurrence, identically or differently, CR or N.

8. The organic electroluminescent device according to claim 1, wherein a maximum of one symbol X per ring stands for N and in that a maximum of one symbol W per ring stands for N.

9. The organic electroluminescent device according to claim 1, wherein the compound of the formula (1) is selected from the compounds of the formulae (3a) to (9a),

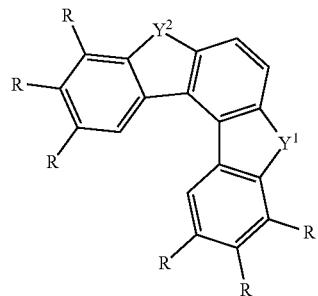

formula (3a)

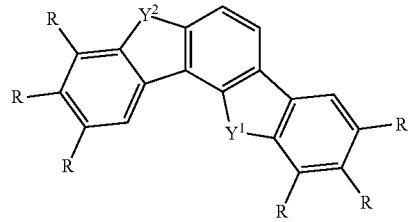

formula (4a)

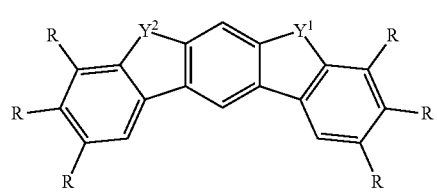

formula (5a)

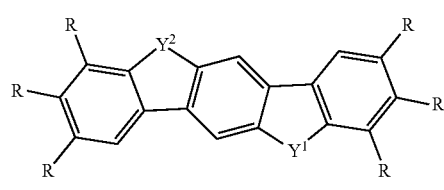

formula (6a)

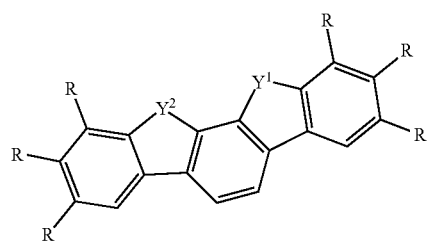

formula (7a)

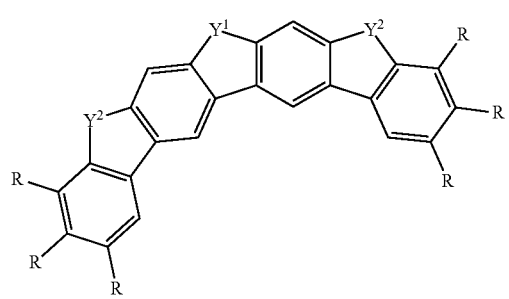

formula (8a)

formula (9a)

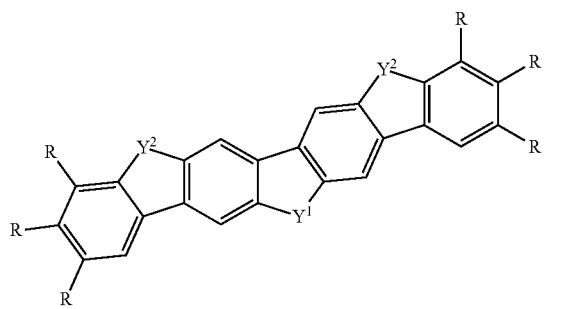

where the symbols used have the meanings given in claim 1.

10. The organic electroluminescent device according to claim 1, wherein $Y^1$ and $Y^2$ are selected, identically or differently on each occurrence, from the group consisting of $CR_2$, NR, O and S, where at least one of the groups $Y^1$ and $Y^2$ to stand for a heteroatom.

11. The organic electroluminescent device according to claim 1, wherein one of the groups $Y^1$ and $Y^2$ stands for $CR_2$ and the other of the groups $Y^1$ and $Y^2$ stands for NR or in that both groups $Y^1$ and $Y^2$ stand for NR or in that both groups $Y^1$ and $Y^2$ stand for O.

12. The organic electroluminescent device according to claim 1, wherein at least one of the groups $Y^1$ and $Y^2$ stands for NR and this substituent R stands for an aromatic or heteroaromatic ring system having 5 to 24 aromatic ring atoms, which may also be substituted by one or more radicals $R^1$.

13. The organic electroluminescent device according to claim 1, wherein at least one of the groups $Y^1$ and $Y^2$ stands for NR and this substituent R stands for an aromatic or heteroaromatic ring system having 5 to 24 aromatic ring atoms, which may also be substituted by one or more radicals $R^1$ which are selected from the group consisting of benzene, ortho-, meta- or para-biphenyl, ortho-, meta-, para- or branched terphenyl, ortho-, meta-, para- or branched quaterphenyl, 1-, 2-, 3- or 4-fluorenyl, 1-, 2-, 3- or 4-spirobifluorenyl, 1- or 2-naphthyl, pyrrole, furan, thiophene, indole, benzofuran, benzothiophene, 1-, 2- or 3-carbazole, 1-, 2- or 3-dibenzofuran, 1-, 2- or 3-dibenzo-thiophene, indenocarbazole, indolocarbazole, 2-, 3- or 4-pyridine, 2-, 4- or 5-pyrimidine, pyrazine, pyridazine, triazine, phenanthrene and combinations of two or three of these groups, each of which is optionally substituted by one or more radicals $R^1$.

14. The organic electroluminescent device according to claim 1, wherein at least one of the groups $Y^1$ and $Y^2$ stands for $CR_2$ and R stands, identically or differently on each occurrence, for a linear alkyl group having 1 to 10 C atoms or for a branched or cyclic alkyl group having 3 to 10 C atoms or for an aromatic or heteroaromatic ring system having 5 to 24 aromatic ring atoms, which may also be substituted by one or more radicals $R^1$, where the R may also form a ring system with one another.

15. A process for the production of the organic electroluminescent according to claim 1, which comprises applying at least one layer by means of a sublimation process and/or in that at least one layer is applied by means of an organic vapour phase deposition (OVPD) or with the aid of carrier-gas sublimation and/or in that at least one layer is applied from solution, by spin coating or by means of a printing process.

16. An organic electroluminescent device comprising cathode, anode and emitting layer, which consists of the following compounds:

(A) a luminescent organic compound which has a separation between the lowest triplet state $T_1$ and the first excited singlet state $S_1$ of ≤0.15 eV (TADF compound); wherein the at least one TADF compound is selected from the group consisting of

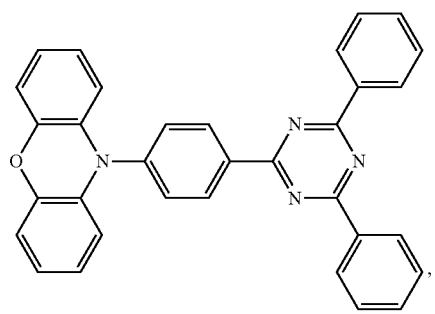

,

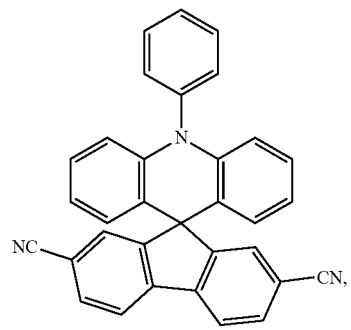

,

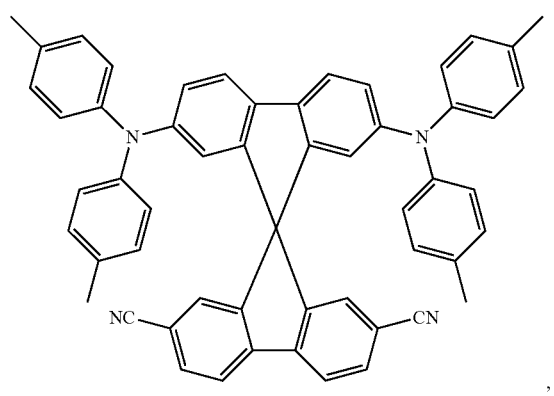

,

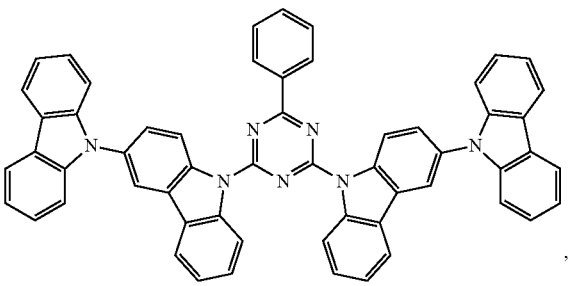

,

69
-continued
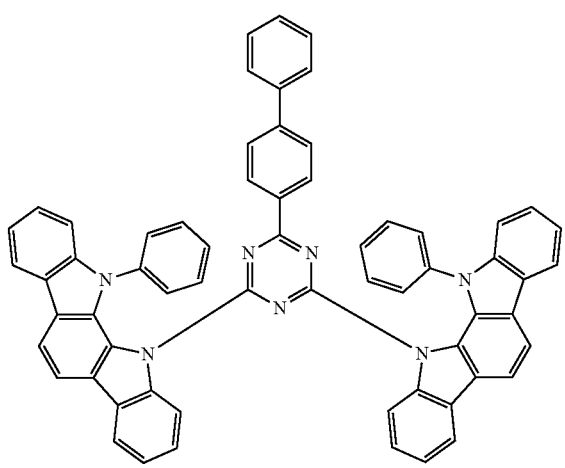
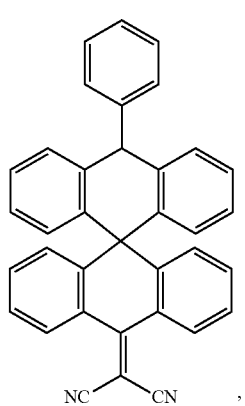
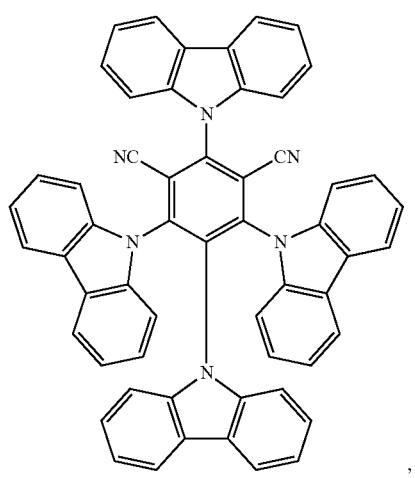
70
-continued
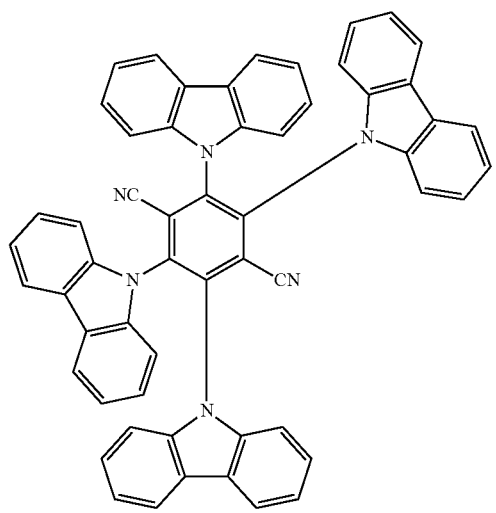
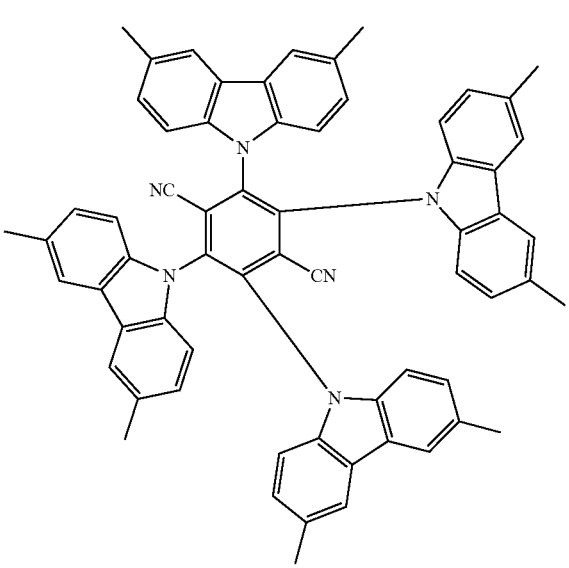
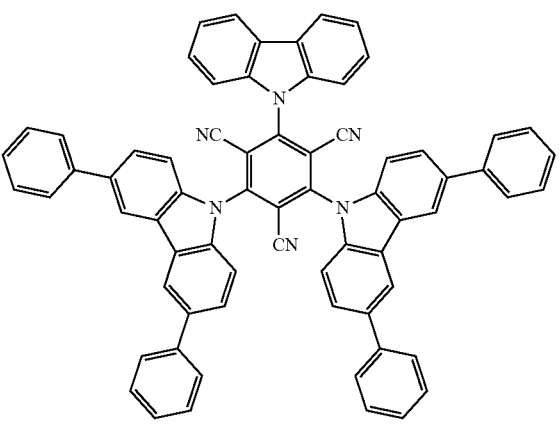

71
-continued
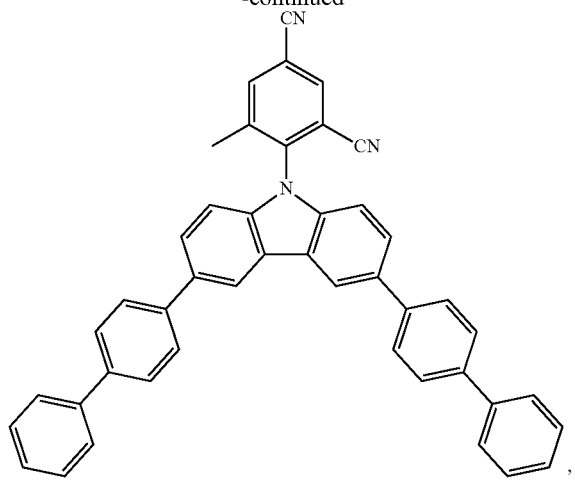
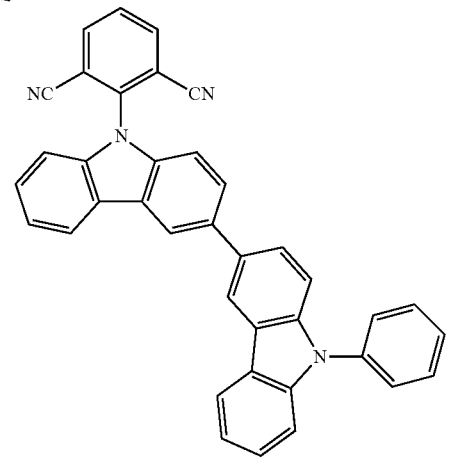
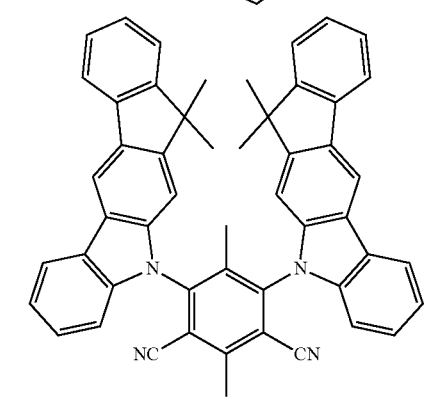
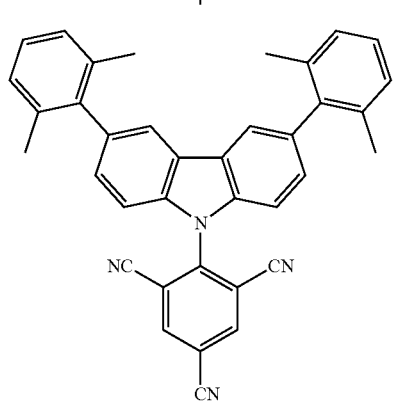
,
72
-continued
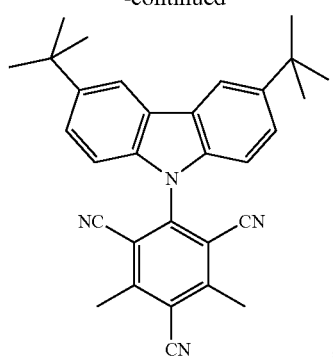
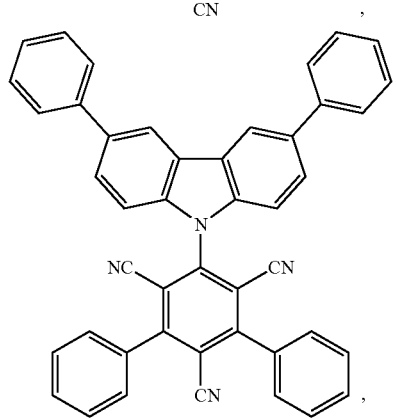
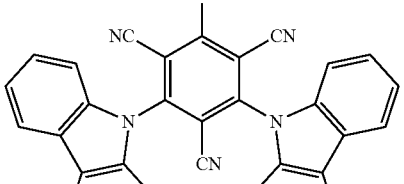
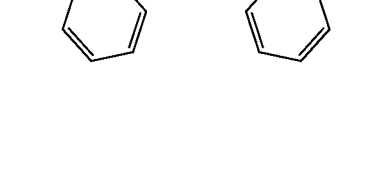
, and
;

and
(B) a compound of the formula (1),

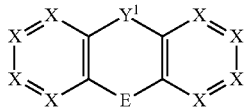

formula (1)

where the following applies to the symbols used:
X is on each occurrence, identically or differently, CR or N, or a group X-X stands for a group of the following formula (2), with the proviso that at least one group X-X stands for a group of the formula (2) and that a maximum of one group X-X per ring stands for a group of the formula (2),

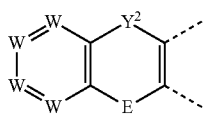

formula (2)

where the C atoms with the dashed bonds indicate the bonding of the group;
$Y^1$, $Y^2$ are selected on each occurrence, identically or differently, from the group consisting of $CR_2$, NR, O, S, $SiR_2$, BR, PR and P(=O)R;
E is selected on each occurrence, identically or differently, from the group consisting of a single bond, $CR_2$, NR, O, S, $SiR_2$, BR, PR and P(=O)R;
W is on each occurrence, identically or differently, CR or N;
R is selected on each occurrence, identically or differently, from the group consisting of H, D, F, Cl, Br, I, CN, $NO_2$, $N(Ar)_2$, $N(R^1)_2$, C(=O)Ar, C(=O)$R^1$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals R', where one or more non-adjacent $CH_2$ groups is optionally replaced by $R^1C=CR^1$, C≡C, $Si(R^1)_2$, C=O, C=S, C=$NR^1$, P(=O)$(R^1)$, SO, $SO_2$, $NR^1$, O, S or $CONR^1$ and where one or more H atoms is optionally replaced by D, F, Cl, Br, I, CN or $NO_2$, an aromatic or heteroaromatic ring system having 5 to 80, which may in each case be substituted by one or more radicals $R^1$, an aryloxy or heteroaryloxy group having 5 to 60 aromatic ring atoms, which is optionally substituted by one or more radicals $R^1$, or an aralkyl or heteroaralkyl group having 5 to 60 aromatic ring atoms, which is optionally substituted by one or more radicals $R^1$, where two or more adjacent substituents R may optionally form a monocyclic or polycyclic, aliphatic, aromatic or heteroaromatic ring system, which is optionally substituted by one or more radicals $R^1$;
$R^1$ is selected on each occurrence, identically or differently, from the group consisting of H, D, F, Cl, Br, I, CN, $NO_2$, $N(Ar)_2$, $N(R^2)_2$, C(=O)Ar, C(=O)$R^2$, P(=O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C=CR^2$, C≡C, $Si(R^2)_2$, C=O, C=S, C=$NR^2$, P(=O)$(R^2)$, SO, $SO_2$, $NR^2$, O, S or CONR and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;
Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from $N(R^2)$, $C(R^2)_2$, O or S; and
$R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

* * * * *